(12) United States Patent
Andres et al.

(10) Patent No.: US 8,063,394 B2
(45) Date of Patent: Nov. 22, 2011

(54) INTEGRATED CIRCUIT

(75) Inventors: Dieter Andres, Munich (DE); Rainer Bruchhaus, Sunnyvale, CA (US); Ulrike Gruening-Von Schwerin, Munich (DE); Ulrich Klostermann, Munich (DE); Franz Kreupl, Munich (DE); Michael Kund, Tuntenhausen (DE); Petra Majewski, Munich (DE); Christian Ruester, Augsburg (DE); Bernhard Ruf, Sauerlach (DE); Ralf Symanczyk, Munich (DE); Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 417 days.

(21) Appl. No.: 12/247,763

(22) Filed: Oct. 8, 2008

(65) Prior Publication Data

US 2010/0084741 A1 Apr. 8, 2010

(51) Int. Cl.
*H01L 29/02* (2006.01)
(52) U.S. Cl. .......... 257/4; 257/2; 257/E47.002; 365/148
(58) Field of Classification Search .................. 257/2, 4, 257/214, 298, E45.002; 365/148
See application file for complete search history.

(56) References Cited

U.S. PATENT DOCUMENTS

| | | | | |
|---|---|---|---|---|
| 6,351,406 | B1 * | 2/2002 | Johnson et al. | 365/103 |
| 7,022,555 | B2 * | 4/2006 | Moore et al. | 438/128 |
| 7,579,232 | B1 * | 8/2009 | Ping et al. | 438/237 |
| 7,786,461 | B2 * | 8/2010 | Lung | 257/2 |
| 7,791,057 | B2 * | 9/2010 | Lung et al. | 257/2 |
| 7,852,658 | B2 * | 12/2010 | Liu et al. | 365/148 |
| 7,859,036 | B2 * | 12/2010 | Liu et al. | 257/296 |
| 2007/0012956 | A1 * | 1/2007 | Gutsche et al. | 257/246 |
| 2009/0021977 | A1 * | 1/2009 | Kang et al. | 365/163 |

OTHER PUBLICATIONS

Black, C.T., et al., "Polymer self assembly in semiconductor microelectronics," International Electron Devices Meeting, 2006, Dec. 11-13, 2006, 4 pages, IEEE.

Yamashita, I., "Bio Nano Process: Fabrication of Nanoelectronic Devices Using Protein Supramolecules," International Electron Devices Meeting, 2006, Dec. 11-13, 2006, 4 pages, IEEE.

* cited by examiner

*Primary Examiner* — Julio J Maldonado
(74) *Attorney, Agent, or Firm* — John S. Economou

(57) ABSTRACT

According to an embodiment, an integrated circuit including a plurality of resistance changing memory cells is disclosed. Each memory cell includes a first electrode, a second electrode and resistance changing memory element arranged between the first electrode and the second electrode. A front surface area of an end section of the first electrode that faces the resistance changing memory element is smaller than a front surface area of an end section of the second electrode that faces the resistance changing memory element.

9 Claims, 23 Drawing Sheets

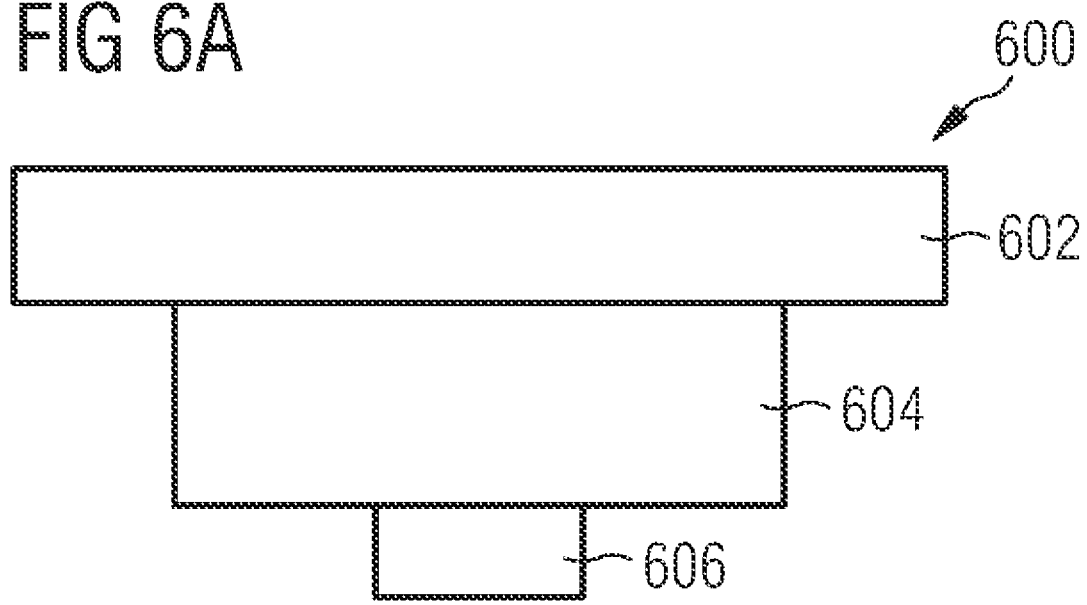
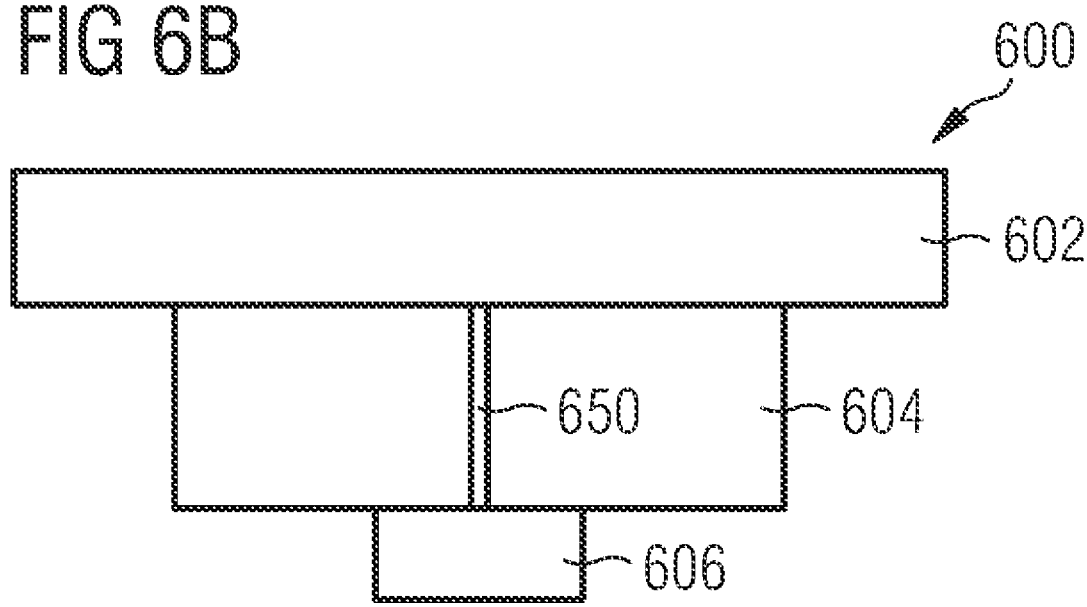

TO SELECT DIVICE

INTEGRATED CIRCUIT

TECHNICAL FIELD

The present invention relates generally to an integrated circuit having a plurality of resistance changing memory cells.

BACKGROUND

Integrated circuits having a plurality of resistance changing memory cells are known. It is desirable to provide integrated circuits having improved characteristics.

SUMMARY OF THE INVENTION

According to an embodiment, the invention provides an integrated circuit including a plurality of resistance changing memory cells, each memory cell including a first electrode, a second electrode and a resistance changing memory element arranged between the first electrode and the second electrode, wherein a front surface area of an end section of the first electrode facing the resistance changing memory element is smaller than a front surface area of an end section of the second electrode facing the resistance changing memory element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6A shows a schematic cross-sectional view of a memory cell according to an embodiment;

FIG. 6B shows a schematic cross-sectional view of a memory cell according to an embodiment;

DETAILED DESCRIPTION OF ILLUSTRATIVE EMBODIMENTS

As used herein the terms "connected" and "coupled" are intended to include both direct and indirect connection and coupling, respectively.

Figure 1:
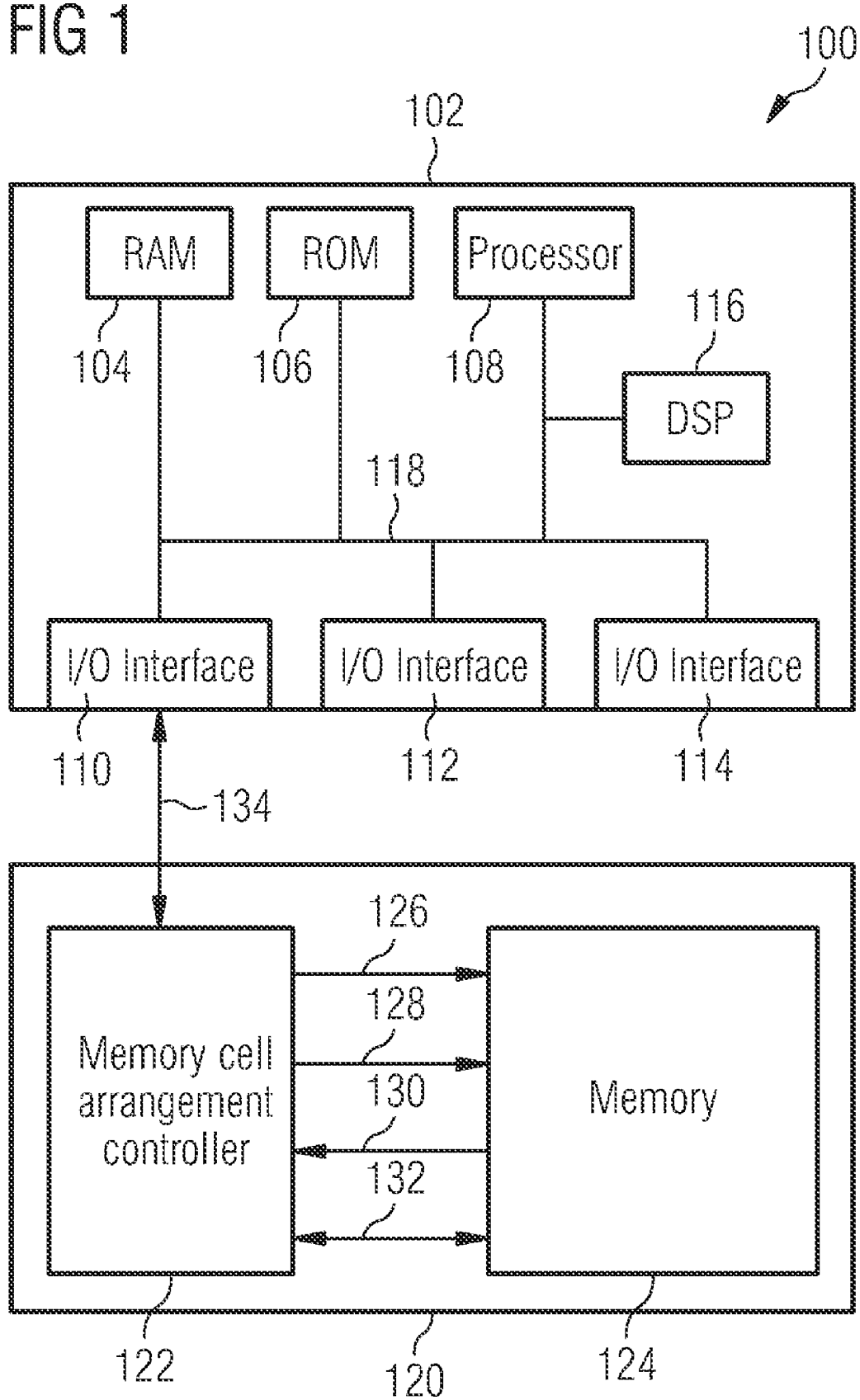
FIG. 1 shows a schematic view of an integrated circuit according to an embodiment.

FIG. 1 shows a computer system 100 having a computer arrangement 102 and a memory cell arrangement 120 (integrated circuit) in accordance with an embodiment.

In various embodiments, the computer arrangement 102 may be configured as or may include any device having a processor, e.g., having a programmable processor such as, e.g., a microprocessor (e.g., a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), or another device having a processor (such as, e.g., a household appliance (such as, e.g., a washing machine, a dishwashing machine, etc.))

In an embodiment, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/output interfaces 110, 112, 114 may be implemented in accordance with one of the following communication protocols: an ad hoc communication protocol such as, e.g., Firewire or Bluetooth; a communication protocol for a serial data transmission such as, e.g., RS-232, Universal Serial Bus (USB) (e.g., USB 1.0, USB 1.1, USB 2.0, USB 3.0); any other communication protocol such as, e.g., Infrared Data Association (IrDA).

In an embodiment, the first input/output interface 110 is a USB interface (in alternative embodiments, the first input/output interface 110 may be configured in accordance with any other communication protocol such as, e.g., in accordance with a communication protocol which has been described above).

In an embodiment, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment, may include the memory cell arrangement 120.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example, implemented by means of hard wired logic and/or by means of one or a plurality of programmable processors, e.g., by means of one or a plurality of programmable processors such as, e.g., one or a plurality of programmable microprocessors) (e.g., CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g., by means of an USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

Figure 2:
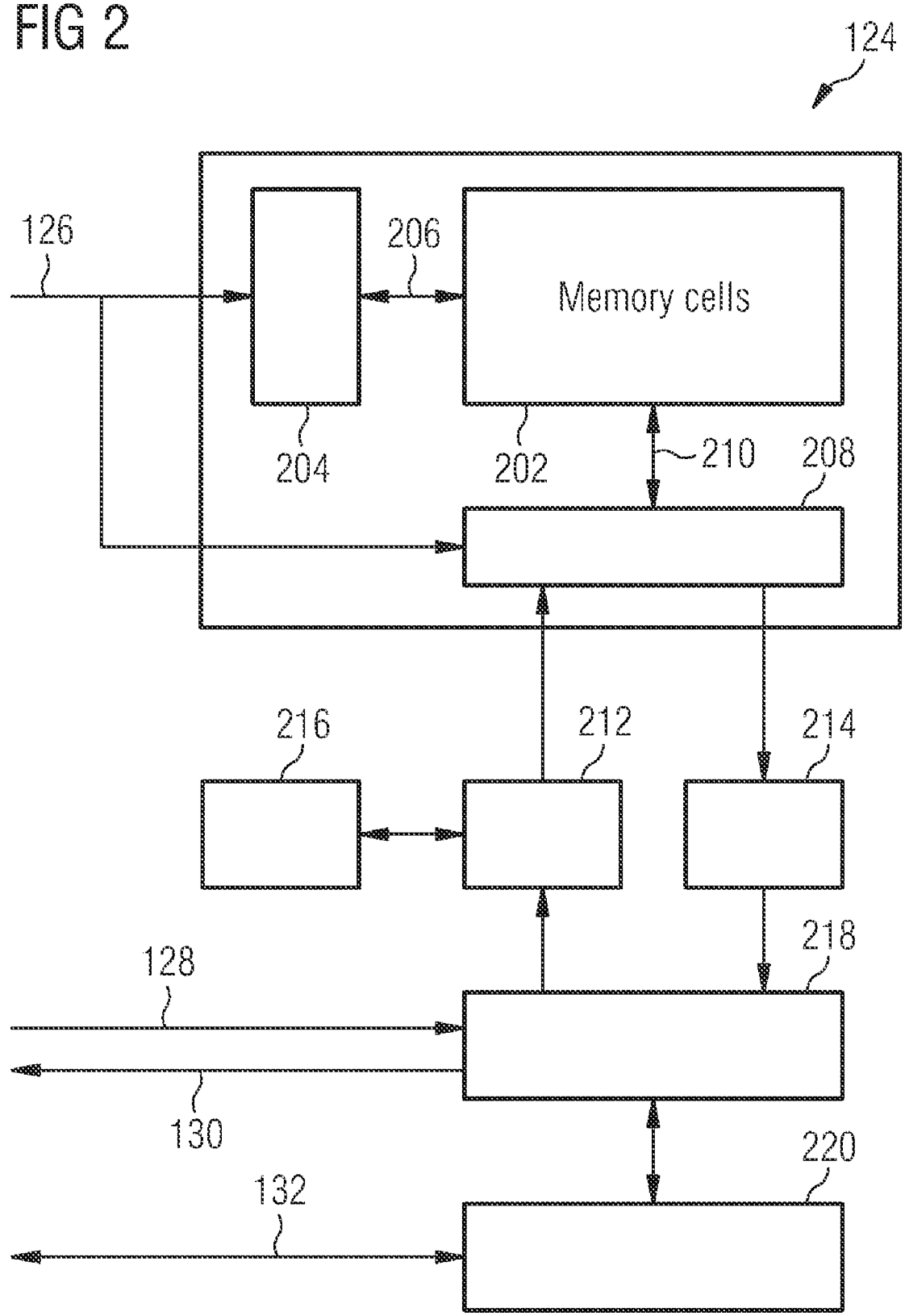
FIG. 2 shows a detailed view of a part of the integrated circuit shown in FIG. 1 according to an embodiment.

FIG. 2 shows the memory 124 of FIG. 1 in accordance with an embodiment in more detail.

In an embodiment, the memory 124 may include a memory cell field (e.g., a memory cell array) 202 having a plurality of memory cells. The memory cells may be arranged in the memory cell field 202 in the form of a matrix in rows and columns, or, alternatively, for example, in zig zag form. In other embodiments, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment, the memory cells are non-volatile memory cells.

A "non-volatile memory cell" may be understood as a memory cell storing data even if it is not active. In an embodiment, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of: phase change random access memory cells (PCRAM, for example, so called Ovonic Unified Memory (OUM) memory cells); conductive filament random access memory cells (e.g., conductive bridging random access memory cells (CBRAM), also referred to as programmable metallization cells (PMC), or carbon-based conductive filament random access memory cells); and transition metal oxide (TMO) memory cells.

In alternative embodiments, also other types of non-volatile memory cells may be used.

In an embodiment, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row and thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing one memory cell or a plurality of memory cells, are applied to the selected at least one row control line 206 and to the at least one column control line 210.

In the case that each memory cell is configured in the form of a resistive memory cell having only two terminals, a first terminal of the resistive memory cell may be coupled to the row control line 206 and a second terminal of the resistive memory cell may be coupled to the column control line 210.

In an embodiment, by way of example, for reading or for programming, a single row control line 206 and a single column control line 210 are selected at the same time and are appropriately driven for reading or programming of the thus selected memory cell. In an alternative embodiment, it may be provided to respectively select a single row control line 206 and a plurality of column control lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented, e.g., by means of an electrical current, which flows through the addressed memory cell and the corresponding column control line 210, which may be compared with a current threshold value in order to determine the content of the memory cell, wherein the current threshold value may, e.g., be dependent on the reference memory cells 216) are, e.g., buffered in the read buffer memory 214 during the read operation. The result of the comparison and therewith the logic state of the memory cell (wherein the logic state of the memory cell represents the memory content of the memory cell) may then be stored in the data register 218 and may be provided via the data read connection 130, with which the data register 218 may be coupled.

The access operations (e.g., write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits, etc.) may be provided in the memory 124, but they are neither shown in FIG. 1 nor FIG. 2 for reasons of clarity.

Figure 3:
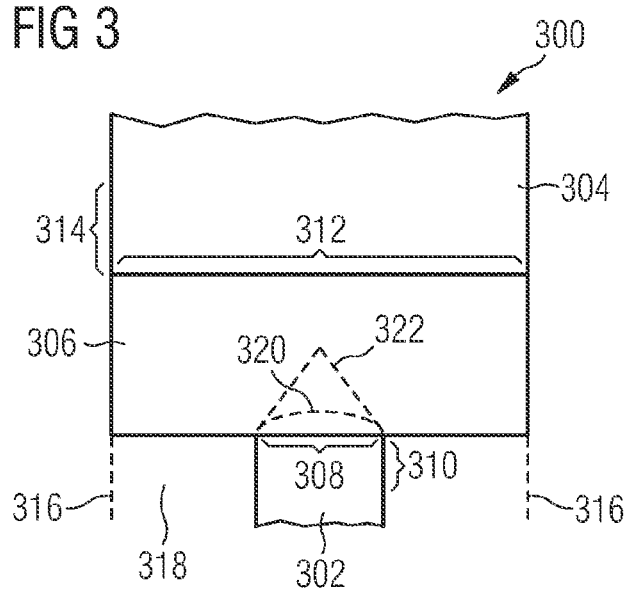
FIG. 3 shows a schematic cross-sectional view of a memory cell according to an embodiment.

FIG. 3 shows a memory cell 300 according to an embodiment. A plurality of such memory cells may form the memory cell field 202 shown in FIG. 2.

The memory cell 300 includes a first electrode 302, a second electrode 304 and resistance changing memory element 306 arranged between the first electrode 302 and the second electrode 304, wherein a front surface area 308 of an end section 310 of the first electrode 302 facing the resistance changing memory element 306 is smaller than a front surface area 312 of an end section 314 of the second electrode 304 facing the resistance changing memory element 306.

One effect of this embodiment is that, compared to conventional memory cells, a lower voltage is needed in order to switch the memory cell 300 from a high resistive state into a low resistive state, and vice versa. The small front surface area 308 generates a high current density at the interface between the first electrode 302 and the resistance changing memory element 306. Assuming that the front surface areas 308 and 312 had the same dimensions, a higher voltage would be needed between the first electrode 302 and the second electrode 304 to generate the same current density.

As shown by dotted lines 316, the first electrode 302 may be laterally surrounded by isolation material 318.

As shown by dotted lines 320, the front surface area 308 may have a rounded shape instead of a flat shape. In this way, the current density between the first electrode 302 and the resistance changing memory element 306 may be increased even further. The isolation material 318 may be replaced by resistance changing memory element material, i.e., the resistance changing memory element 306 may also laterally surround the whole first electrode 302. Instead of a rounded shape, the front surface area 308 may also have a conical shape, as indicated by the dotted lines 322.

Here, the end section 310 of the first electrode 302 has a pillar like shape, i.e. the cross-sectional area of the end section 310 remains constant when propagating towards the front surface area 308. Alternatively, the end section 310 of the first electrode 302 has a conical shape (not shown) such that a cross-sectional area of the end section 310 decreases when propagating towards the front surface area 308 of the end section 310.

FIG. 4 shows a memory cell 400 according to an embodiment. A plurality of such memory cells may form the memory cell field 202 shown in FIG. 2.

Figures 4A, 4B:
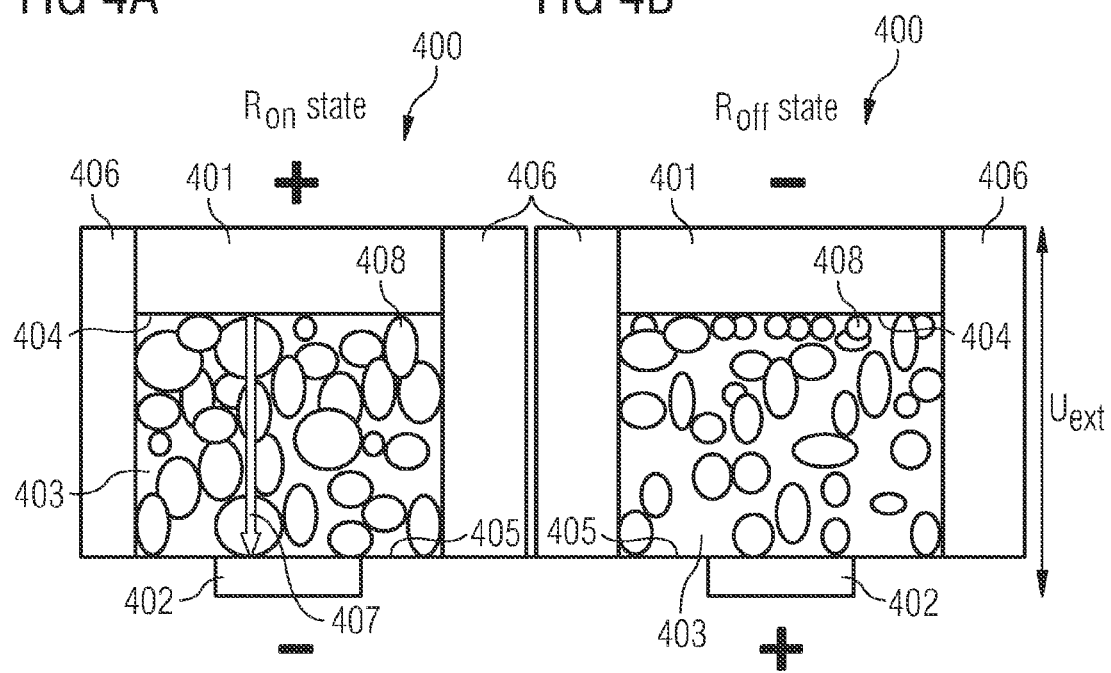
FIG. 4A shows a schematic cross-sectional view of a memory cell according to an embodiment.
FIG. 4B shows a schematic cross-sectional view of a memory cell according to an embodiment.

As shown in FIG. 4A, a CBRAM cell 400 may include a first electrode 401, a second electrode 402, and a solid electrolyte block (in the following also referred to as ion conductor block) 403 which includes the active material and which is sandwiched between the first electrode 401 and the second electrode 402. This solid electrolyte block 403 can also be shared between a plurality of memory cells (not shown here). The first electrode 401 may contact a first surface 404 of the ion conductor block 403, the second electrode 402 may contact a second surface 405 of the ion conductor block 403. The ion conductor block 403 may be isolated against its environment by an isolation structure 406. The first surface 404 may be the top surface and the second surface 405 may be the bottom surface of the ion conductor 403. In the same way, the first electrode 401 may be the top electrode, and the second electrode 402 may be the bottom electrode of the CBRAM cell. One of the first electrode 401 and the second electrode 402 may be a reactive electrode, the other one may be an inert electrode. In this example, the first electrode 401 may be the reactive electrode, and the second electrode 402 may be the inert electrode. In this example, the first electrode 401 may include silver (Ag), the ion conductor block 403 may include silver-doped chalcogenide material, the second electrode 402 may include tungsten (W), and the isolation structure 406 may include $SiO_2$ or $Si_3N_4$. The various embodiments are however not restricted to these materials. For example, the first electrode 401 may alternatively or additionally include copper (Cu) or zinc (Zn), and the ion conductor block 403 may alternatively or additionally include copper-doped chalcogenide material. Further, the second electrode 402 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned materials, and can also include alloys of the aforementioned materials. The thickness of the ion conductor 403 may, for example, range between about 5 nm and about 500 nm. The thickness of the first electrode 401 may, for example, range between about 10 nm and about 100 nm. The thickness of the second electrode 402 may, for example, range between about 5 nm and about 500 nm, between about 15 nm to about 150 nm, or between about 25 nm and about 100 nm. It is to be understood that the embodiments are not restricted to the above-mentioned materials and thicknesses.

Similar to the memory cell 300 shown in FIG. 3, one of the electrodes (here, the first electrode 401) of the memory cell 400 has a reduced front surface area which leads to the same effects as discussed in conjunction with the memory cell 300. The same embodiments/modifications as already discussed in conjunction with the memory cell 300 (e.g., rounded or conical shape of the first electrode 401) may also be applied to the memory cell 400.

In the context of this description, chalcogenide material (ion conductor) may be understood, for example, as any compound containing oxygen, sulphur, selenium, germanium and/or tellurium. In accordance with one embodiment of the invention, the ion conducting material is, for example, a compound, which is made of a chalcogenide and at least one metal of the group I or group II of the periodic system, for example, arsenic-trisulfide-silver. Alternatively, the chalcogenide material may contain germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 4A is applied across the ion conductor block 403, a redox reaction is initiated which drives $Ag^+$ ions out of the first electrode 401 into the ion conductor block 403 where they are reduced to Ag, thereby forming Ag rich clusters 408 within the ion conductor block 403. If the voltage applied across the ion conductor block 403 is applied for an enhanced period of time, the size and the number of Ag rich clusters within the ion conductor block 403 is increased to such an extent that a conductive bridge 407 between the first electrode 401 and the second electrode 402 is formed. In case that a voltage is applied across the ion conductor 403 as shown in FIG. 4B (inverse voltage compared to the voltage applied in FIG. 4A), a redox reaction is initiated which drives $Ag^+$ ions out of the ion conductor block 403 into the first electrode 401 where they are reduced to Ag. As a consequence, the size and the number of Ag rich clusters 408 within the ion conductor block 403 is reduced, thereby erasing the conductive bridge 407. After having applied the voltage/inverse voltage, the memory cell 400 remains within the corresponding defined switching state even if the voltage/inverse voltage has been removed.

In order to determine the current memory status of a resistive memory cell such as, e.g., a CBRAM cell, for example, a sensing current is routed through the resistive memory cell such as, e.g., a CBRAM cell. The sensing current experiences a high resistance, e.g., in case no conductive bridge 407 exists within the CBRAM cell, and experiences a low resistance in case a conductive bridge 407 exists within the CBRAM cell. A high resistance may, for example, represent a first logic state "0", whereas a low resistance represents a second logic "1", or vice versa. The memory status detection may also be carried out using sensing voltages. Alternatively, a sensing voltage may be used in order to determine the current memory status of the resistive memory cell such as, e.g., a CBRAM cell.

Figure 5A:
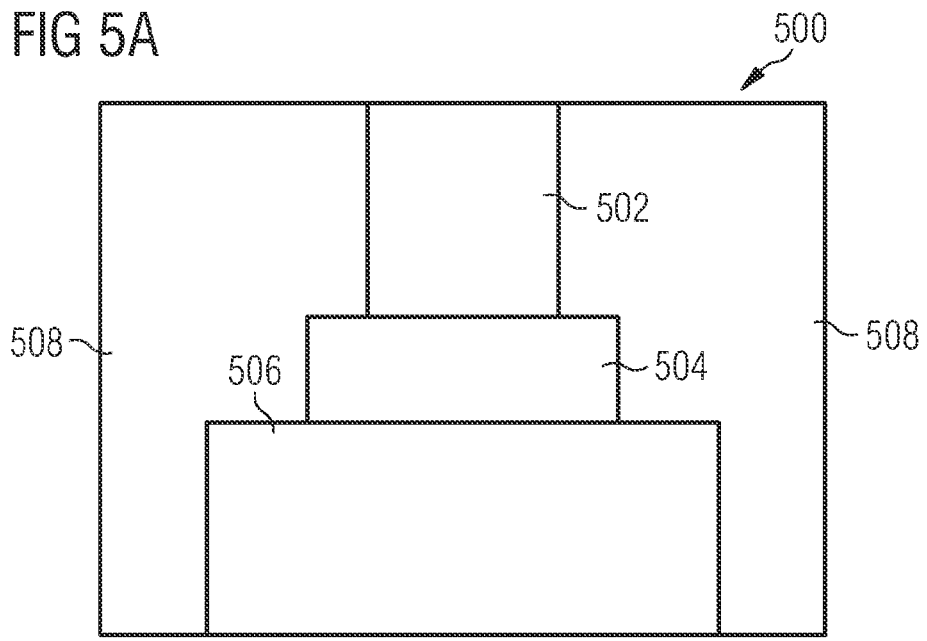
FIG. 5A shows a schematic cross-sectional view of a memory cell according to an embodiment.

FIG. 5A shows a memory cell 500 according to an embodiment. A plurality of such memory cells may form the memory cell field 202 shown in FIG. 2.

The memory cell 500 is a phase changing memory cell that includes a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states may also be used.

The phase changing memory cell 500 may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may be routed through the phase changing material (or a sensing voltage may be applied across the phase changing material), thereby sensing the resistivity of the resistivity changing memory cell 500, which represents the memory state of the memory cell 500.

The phase changing memory cell 500 includes a first electrode 502, a phase changing material 504, a second electrode 506, and an insulating material 508. The phase changing material 504 is laterally enclosed by the insulating material 508. To use the phase changing memory cell, a selection device (not shown), such as a transistor, a diode, or another active device, may be coupled to the first electrode 502 or to the second electrode 506 to control the application of a current or a voltage to the phase changing material 504 via the first electrode 502 and/or the second electrode 506. To set the phase changing material 504 to the crystalline state, a current pulse and/or voltage pulse may be applied to the phase changing material 504, wherein the pulse parameters are chosen such that the phase changing material 504 is heated above its crystallization temperature, while keeping the temperature below the melting temperature of the phase changing material 504. To set the phase changing material 504 to the amorphous state, a current pulse and/or voltage pulse may be applied to the phase changing material 504, wherein the pulse parameters are chosen such that the phase changing material 504 is quickly heated above its melting temperature, and is quickly cooled.

The phase changing material 504 may include a variety of materials. According to one embodiment, the phase changing material 504 may include or consist of a chalcogenide alloy that includes one or more elements from group VI of the periodic table. According to another embodiment, the phase changing material 504 may include or consist of a chalcogenide compound material, such as GeSbTe, SbTe, GeTe or AgInSbTe. According to a further embodiment, the phase changing material 504 may include or consist of chalcogen free material, such as GeSb, GaSb, InSb, or GeGaInSb. According to still another implementation, the phase changing material 504 may include or consist of any suitable material including one or more of the elements Ge, Sb, Te, Ga, Bi, Pb, Sn, Si, P, O, As, In, Se, and S.

According to one example, at least one of the first electrode 502 and the second electrode 506 may include or consist of Ti, V, Cr, Zr, Nb, Mo, Hf, Ta, W, or mixtures or alloys thereof. According to another example, at least one of the first electrode 502 and the second electrode 506 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

Similar to the memory cell 300 shown in FIG. 3, one of the electrodes (here, the first electrode 502) of the memory cell 500 has a reduced front surface area which leads to the same effects as discussed in conjunction with the memory cell 300. The same embodiments/modifications as already discussed in conjunction with the memory cell 300 (e.g., rounded or conical shape of the first electrode 502) may also be applied to the memory cell 500.

In another example, another type of resistivity changing memory cell may be used as memory cells in the memory cell field 202, which may be formed using carbon as a resistivity changing material. In this type of memory cell, amorphous carbon that is rich in $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In an example, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

In this type of carbon memory cell, application of a first temperature may cause a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 6A and 6B.

Figure 5B:
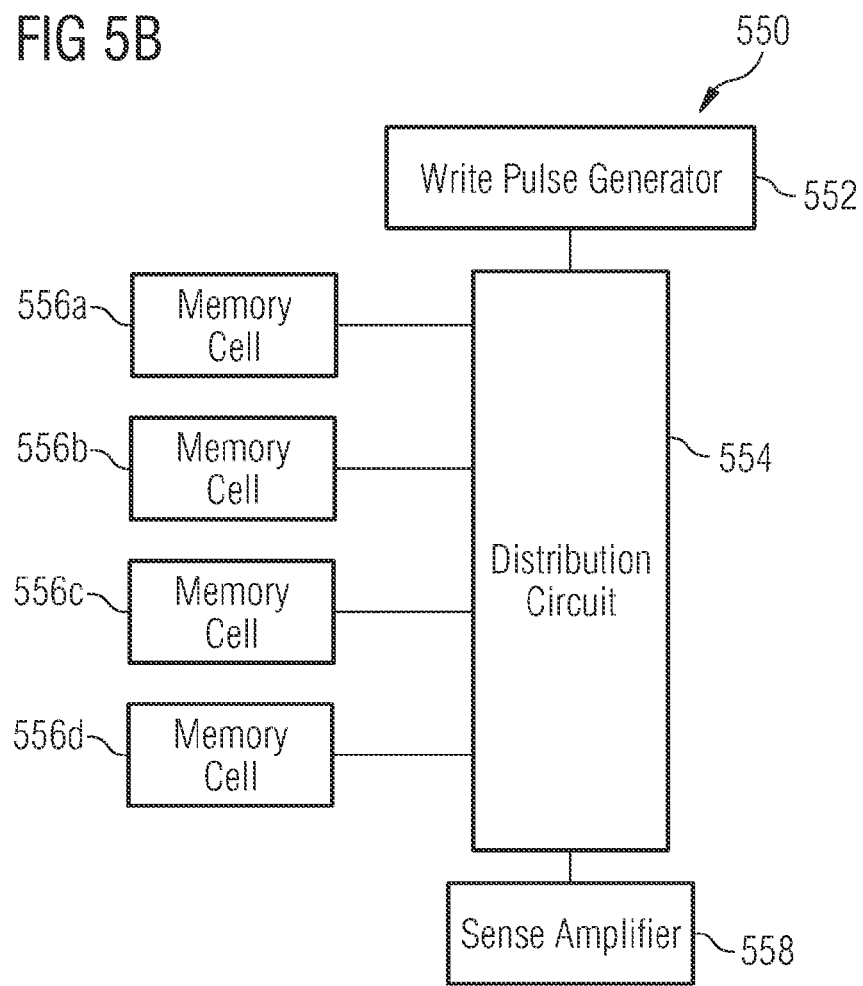
FIG. 5B shows a schematic view of an integrated circuit according to an embodiment.

FIG. 5B shows a memory system 550 including a plurality of memory cells 556a-d coupled to a distribution circuit 554, which is coupled to a write pulse generator 552 for writing to the cells 556a-d and a sense amplifier 558 for reading from the cells 556a-d.

FIG. 6A shows a carbon memory cell 600 that includes a top contact 602, a carbon storage layer 604 including an insulating amorphous carbon material rich in $sp^3$-hybridized carbon atoms, and a bottom contact 606. As shown in FIG. 6B, by forcing a current through the carbon storage layer 604, a $sp^2$ rich filament 650 can be formed in the $sp^3$-rich carbon storage layer 604, changing the resistivity of the memory cell. Application of a current (or voltage) pulse with higher energy (or, in some embodiments, reversed polarity) may destroy the $sp^2$ filament 650, increasing the resistance of the carbon storage layer 604. As discussed above, these changes in the resistance of the carbon storage layer 604 can be used to store information, with, for example, a high resistance state representing a "0" and a low resistance state representing a "1". Additionally, in some embodiments, intermediate degrees of filament formation or formation of multiple filaments in the sp³-rich carbon film may be used to provide multiple varying resistivity levels, which may be used to represent multiple bits of information in a carbon memory cell. In some embodiments, alternating layers of sp³-rich carbon and sp²-rich carbon may be used to enhance the formation of conductive filaments through the sp³-rich layers, reducing the current and/or voltage that may be used to write a value to this type of carbon memory. Similar to the memory cell 300 shown in FIG. 3, one of the electrodes (here, the bottom contact 606) of the memory cell 600 has a reduced front surface area which leads to the same effects as discussed in conjunction with the memory cell 300. The same embodiments/modifications as already discussed in conjunction with the memory cell 300 (e.g., rounded or conical shape of the bottom contact 606) may also be applied to the memory cell 600.

Figure 7A:
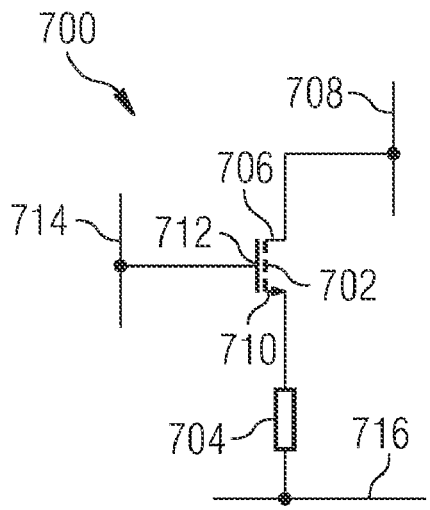
FIG. 7A shows an integrated circuit according to an embodiment.

Resistivity changing memory cells, such as the phase changing memory cells and carbon memory cells described above, may be used as part of a memory cell, along with a transistor, diode, or other active component for selecting the memory cell. FIG. 7A shows a schematic representation of such a memory cell that uses a resistivity changing memory element. The memory cell 700 includes a select transistor 702 and a resistivity changing memory element 704. The select transistor 702 includes a source 706 that is connected to a bit line 708, a drain 710 that is connected to the memory element 704, and a gate 712 that is connected to a word line 714. The resistivity changing memory element 704 is also connected to a common line 716, which may be connected to ground, or to other circuitry, such as circuitry (not shown) for determining the resistance of the memory cell 700, for use in reading. Alternatively, in some configurations, circuitry (not shown) for determining the state of the memory cell 700 during reading may be connected to the bit line 708. It should be noted that as used herein the terms connected and coupled are intended to include both direct and indirect connection and coupling, respectively.

To write to the memory cell 700, the word line 714 may be used to select the memory cell 700, and a current (or voltage) pulse on the bit line 708 is applied to the resistivity changing memory element 704, changing the resistance of the resistivity changing memory element 704. Similarly, when reading the memory cell 700, the word line 714 is used to select the cell 700, and the bit line 708 may be used to apply a reading voltage (or current) across the resistivity changing memory element 704 to measure the resistance of the resistivity changing memory element 704.

Figure 7B:
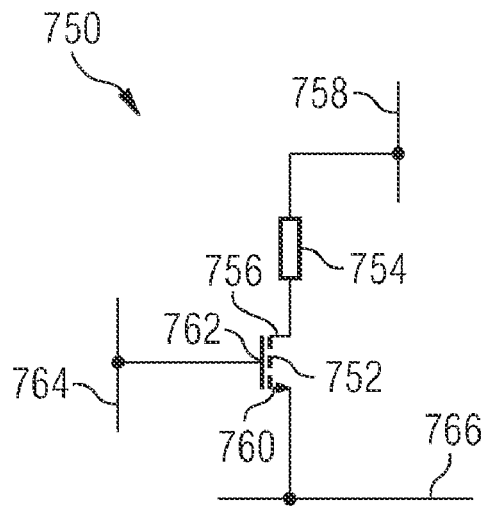
FIG. 7B shows an integrated circuit according to an embodiment.

The memory cell 700 may be referred to as a 1T1J cell, because it uses one transistor, and one memory junction (the resistivity changing memory element 704). Typically, a memory device will include an array of many such cells. It will be understood that other configurations for a 1T1J memory cell, or configurations other than a 1T1J configuration may be used with a resistivity changing memory element. For example, in FIG. 7B, an alternative arrangement for a 1T1J memory cell 750 is shown, in which a select transistor 752 and a resistivity changing memory element 754 have been repositioned with respect to the configuration shown in FIG. 7A. In this alternative configuration, the resistivity changing memory element 754 is connected to a bit line 758, and to a source 756 of the select transistor 752. A drain 760 of the select transistor 752 is connected to a common line 766, which may be connected to ground, or to other circuitry (not shown), as discussed above. A gate 762 of the select transistor 752 is controlled by a word line 764.

Figure 8:
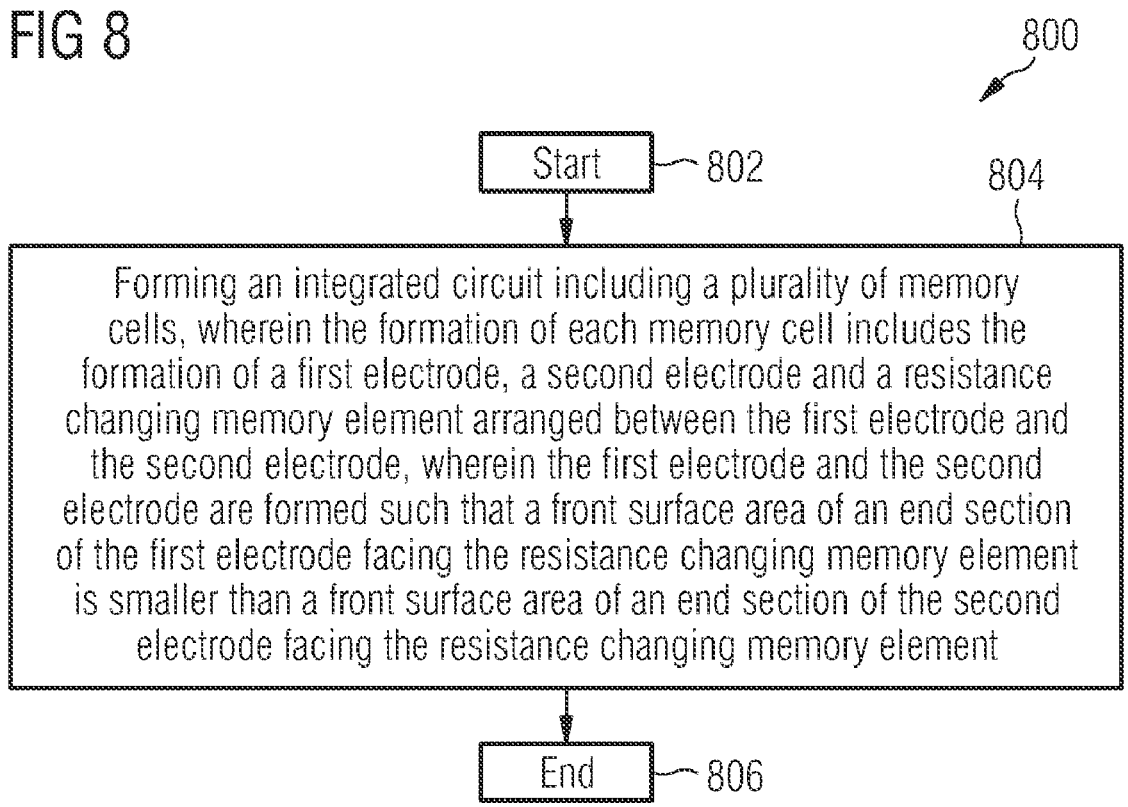
FIG. 8 shows a flow chart of a method of manufacturing an integrated circuit according to an embodiment.

FIG. 8 shows a method 800 of manufacturing an integrated circuit according to an embodiment. At 802, the method is started. Typically, before starting method 800 at 802, front end of line (FEOL) processes like substrate processing are carried out. At 804, a plurality of memory cells are formed, wherein the formation of each memory cell includes the formation a first electrode, a second electrode and a resistance changing memory element arranged between the first electrode and the second electrode, wherein the first electrode and the second electrode are formed such that a front surface area of an end section of the first electrode facing the resistance changing memory element is smaller than a front surface area of an end section of the second electrode facing the resistance changing memory element. At 806, the method 800 is terminated. Typically, after having terminated method 800, back end of line (BEOL) processes like the provision of wiring layers or passivation layers are carried out.

In the following description, making reference to FIGS. 9A to 9D, a possible realization of the method 800 will be described.

Figure 9A:
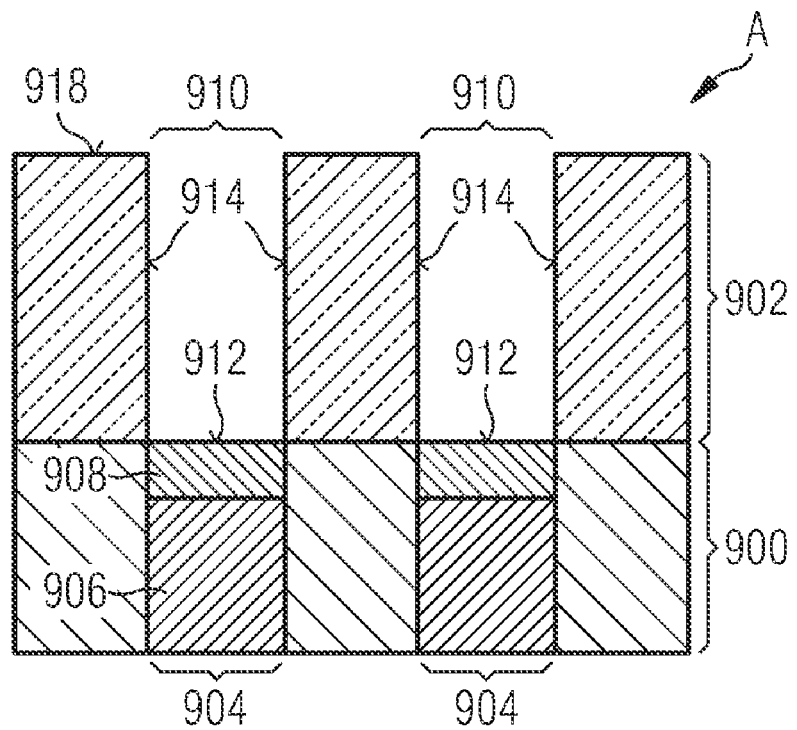
FIGS. 9A to 9D show a method of manufacturing an integrated circuit according to an embodiment.

FIG. 9A shows a manufacturing stage A obtained after having provided a composite structure comprising a substrate 900 and an isolation layer 902 formed on the substrate 900. The substrate 900 may, for example, be a semiconductor substrate or a $Si_3N_4$ substrate. The isolation layer 902 may, for example, be a $SiO_2$ isolation layer. Within the substrate 900, conductive vias 904 have been provided. The conductive vias 904 include a first section of a first conductive material 906 (e.g., tungsten (W) or titanium nitride (TiN), aluminum (Al), or copper (Cu)), and a second section of a second conductive material 908. Here, it is assumed that the second conductive material 908 is conductive carbon. However, the second conductive material 908 may also be any other conductive material like a metal. The lower ends of the conductive vias 904 are connected to select devices like diodes (not shown). Further, within the isolation layer 902, trenches 910 have been formed such that the bottom surfaces of the trenches 910 are formed by the top surfaces 912 of the conductive vias. The conductive vias 904 can be regarded as bottom electrodes of resistance changing memory elements to be formed.

Figure 9B:
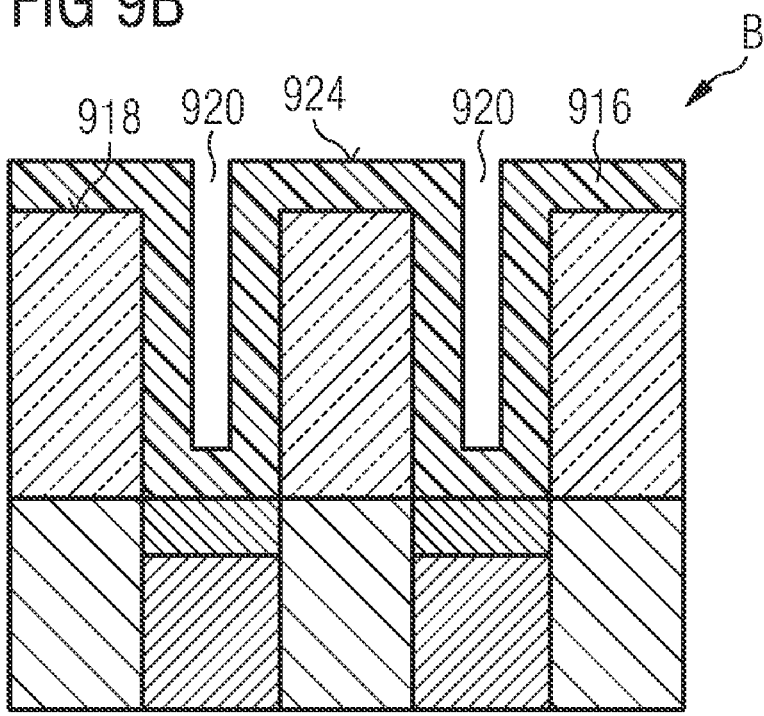

FIG. 9B shows a manufacturing stage B obtained after having covered the inner trench side surface 914 and the top surface 912 of the conductive vias 904 with a resistance changing layer 916. The resistance changing layer 916 also covers the top surface 918 of the isolation layer 902. Here, it is assumed that the resistance changing layer 916 is an isolating carbon layer. However, also other materials like programmable metallization material (PMC cells) or transition metal oxide material (TMO cells) may be used. In the case of TMO cells, the resistance changing material may for example be NiO, ZrO2, WO3, TiO2, or the like.

Figure 9C:
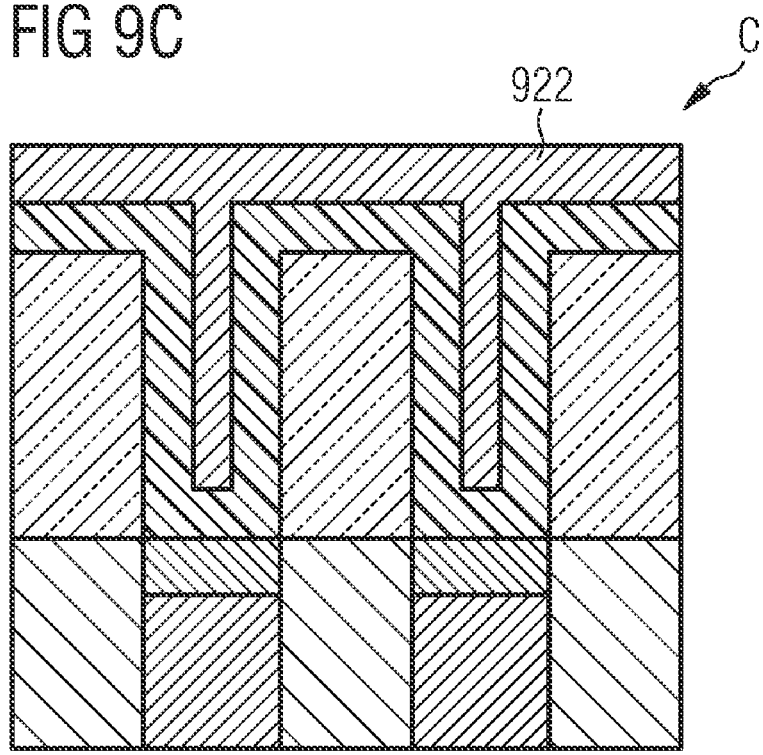

FIG. 9C shows a manufacturing stage C obtained after having filled remaining space 920 within the trenches 910 with conductive material 922. Further, the top surface 924 of the resistance changing layer 916 is covered with the conductive material 922. Here, it is assumed that the conductive material is conductive carbon. However, also other suitable conductive material like a metal can be used.

Figure 9D:
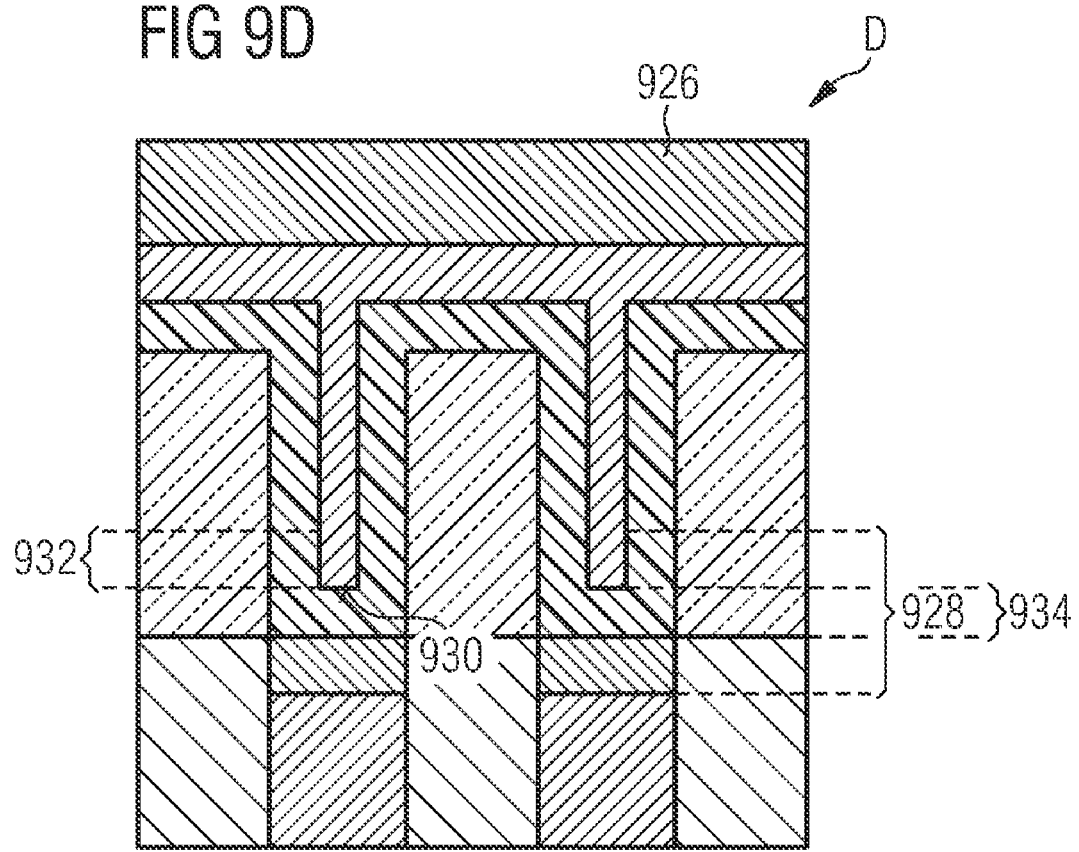

FIG. 9D shows a manufacturing stage D obtained after having covered the layer formed by the conductive material 922 with a further conductive material layer 926, e.g., W, Al, Cu, or TiN. The upper part of the conductive layer 922 together with the further conductive material layer 926 can be regarded as a common top electrode of a plurality of resistance changing memory cells. In this way, resistive memory cells 928 including resistive memory elements 934 are formed within the trenches 910. The front surfaces 930 of the top electrodes facing the resistive memory elements 934 are smaller than the front surfaces 912 of the bottom electrodes facing the resistive memory elements 934. In this way, high current densities at a transition between the top electrodes and the resistive memory elements 934 can be achieved.

In the following description, making reference to FIGS. 10A to 10H, a possible realization of the method 800 will be described.

Figure 10A:
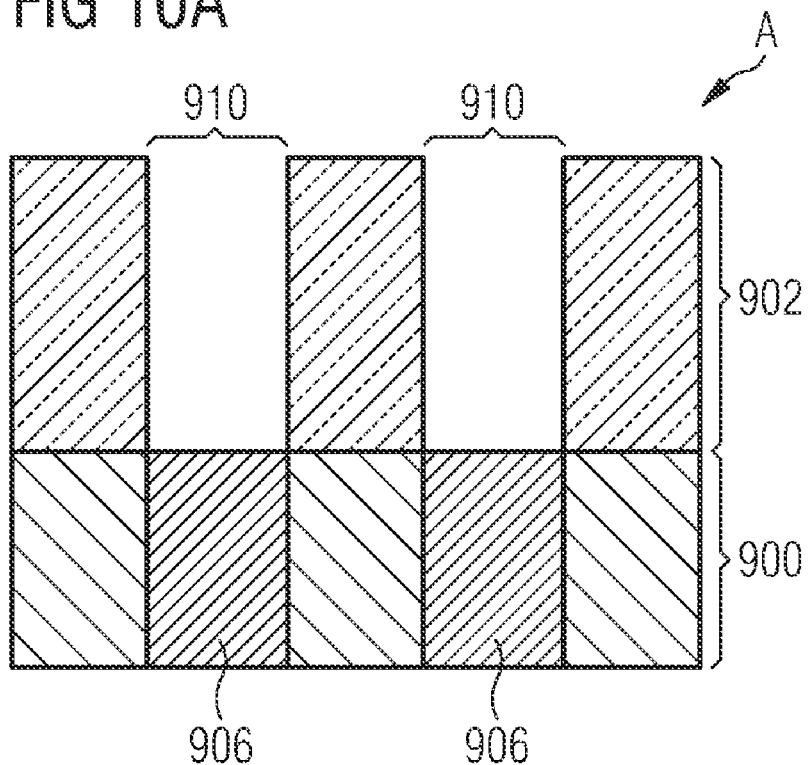
FIGS. 10A to 10H show a method of manufacturing an integrated circuit according to an embodiment.

FIG. 10A shows a manufacturing stage A similar to the manufacturing stage A shown in FIG. 9A. However, the conductive vias 904 only include one conductive material 906 (e.g., tungsten (W), titanium nitride (TiN), aluminum (Al), or copper (Cu)).

Figure 10B:
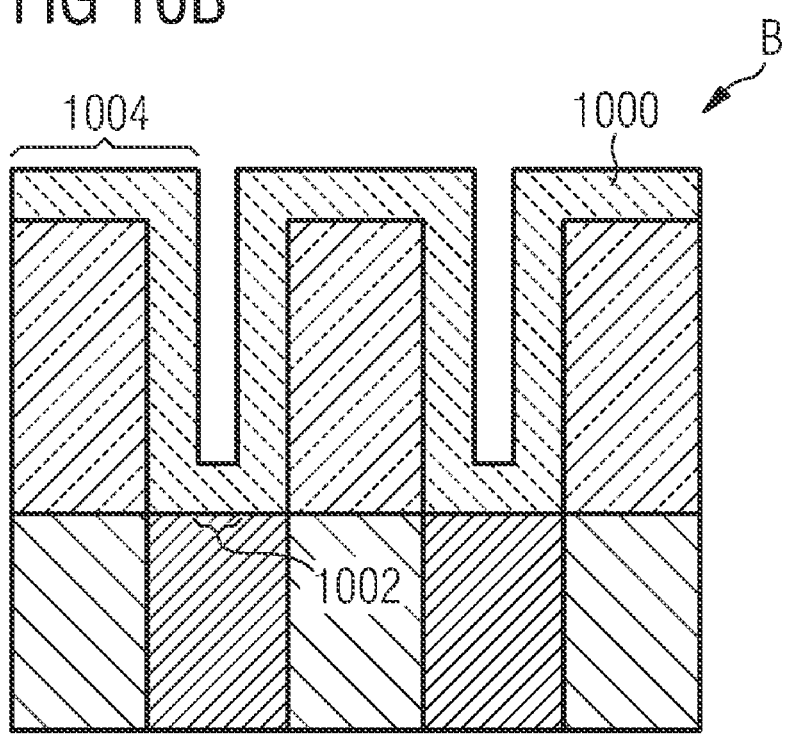

FIG. 10B shows a manufacturing stage B obtained after having covered the inner trench side surface 914 and the top surface 912 of the conductive vias 904 with an auxiliary layer 1000 like an oxide layer. The resistance changing layer 1000 also covers the top surface 918 of the isolation layer 902.

Figure 10C:
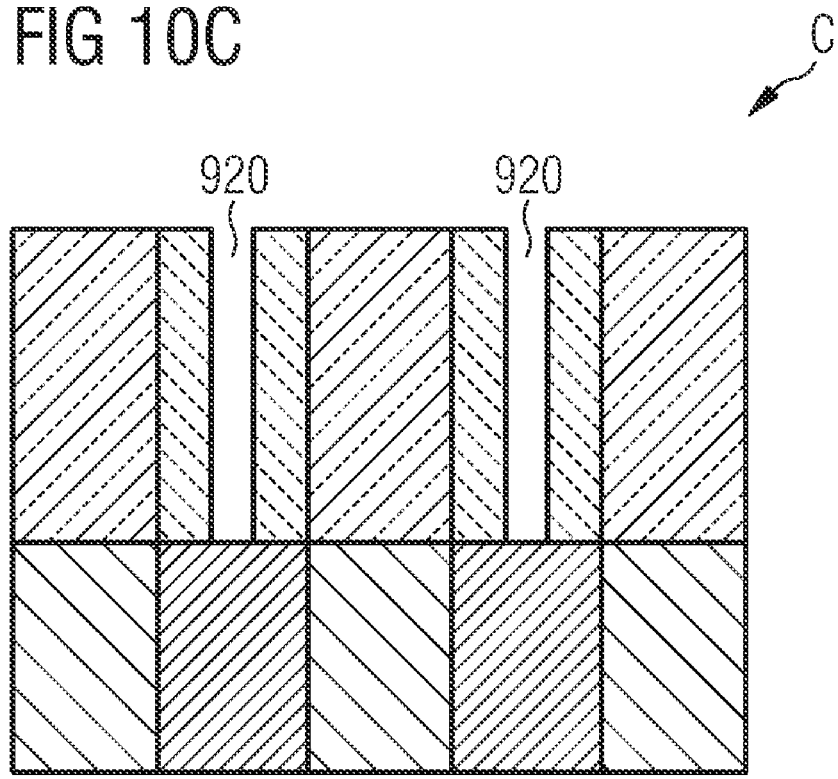

FIG. 10C shows a manufacturing stage C obtained after having removed parts 1002 of the auxiliary layer 1000 covering the center parts of the bottom surfaces of the trenches 910 and parts 1004 of the auxiliary layer 1000 covering the top surface of the isolation layer 902.

Figure 10D:
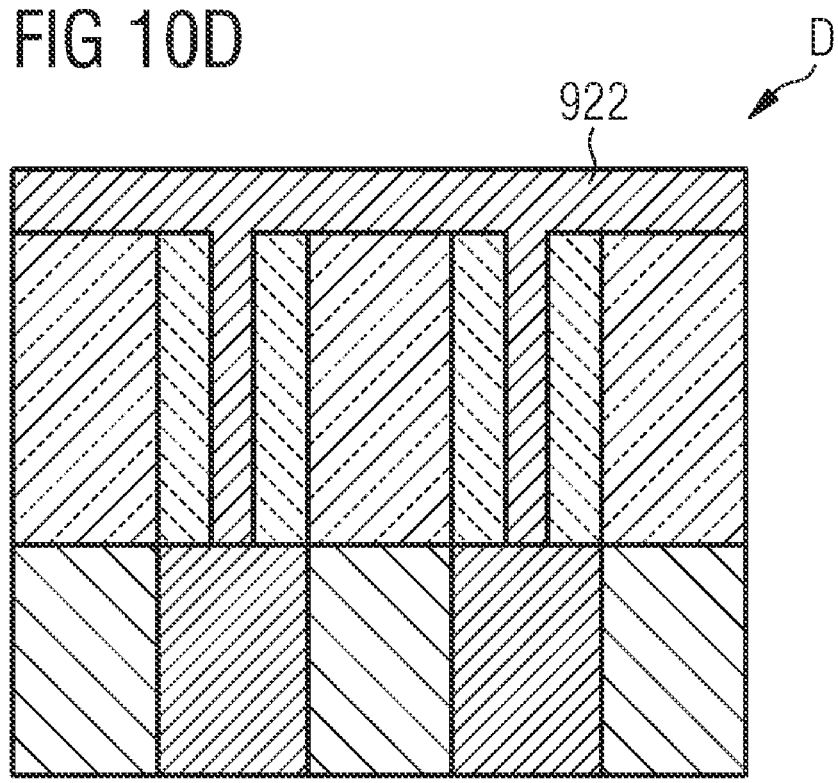

FIG. 10D shows a manufacturing stage D obtained after having filled remaining space 920 within the trenches 910 with conductive material 922. Further, the top surface 924 of the auxiliary layer 1000 and of the isolation layer 902 has been covered with conductive material 922. Here, it is assumed that the conductive material is conductive carbon. However, also other suitable conductive material like a metal can be used.

Figure 10E:
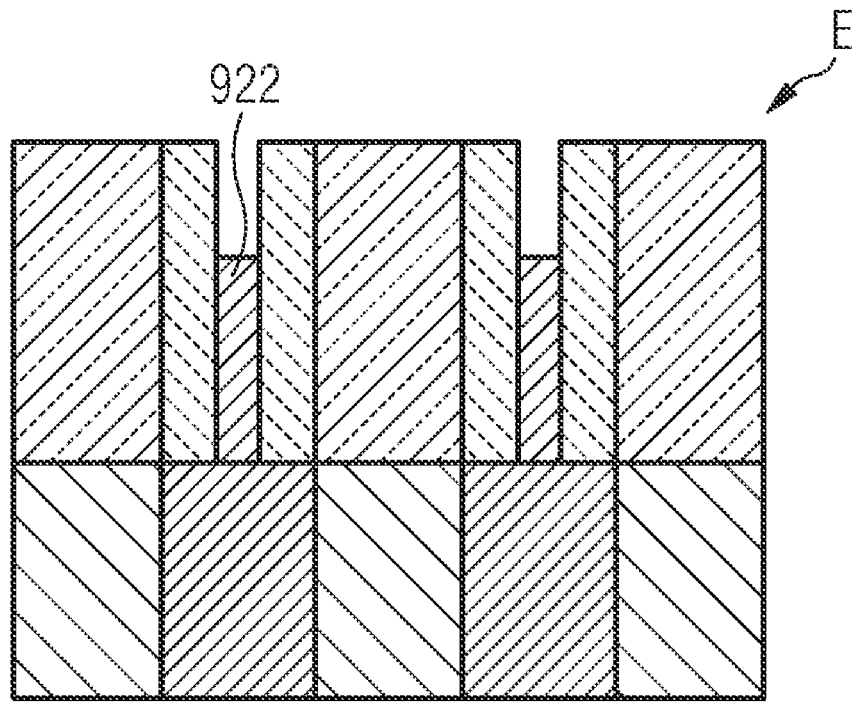

FIG. 10E shows a manufacturing stage E obtained after having removed the conductive material 922 in the upper part of the trenches 910 and on the top surface of the auxiliary layer 1000 and the isolation layer 902 using, for example, a recess etching process.

Figure 10F:
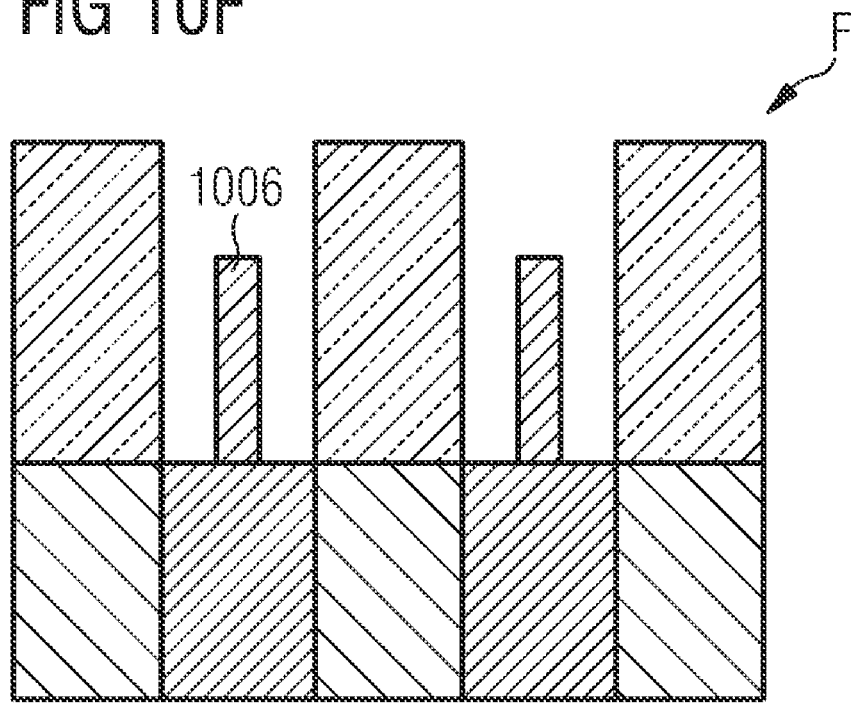

FIG. 10F shows a manufacturing stage F obtained after having removed the auxiliary layer 1000 using, for example, an etching process (e.g., a wet chemical etching process). Further, the upper ends 1006 of the conductive material 922 (i.e., the upper ends of the bottom electrodes) may be sharpened using, for example, a blanket reactive ion etching (RIE) process (not shown).

Figure 10G:
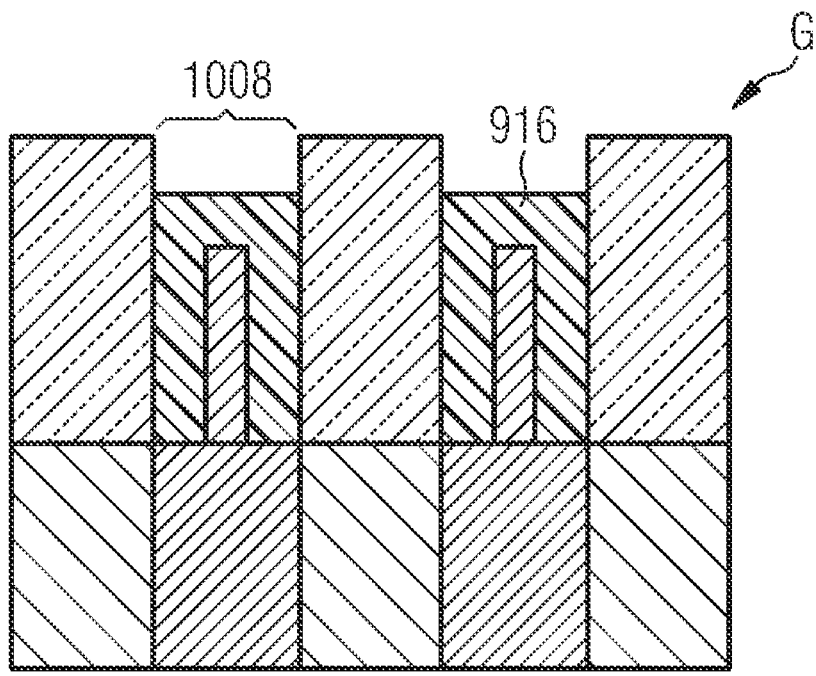

FIG. 10G shows a manufacturing stage G obtained after having filled a lower part of the trenches 910 with resistance changing material 916 such that the upper end 1006 of the remaining conductive material 922 is covered with resistance changing material 916. Here, it is assumed that the resistance changing layer 916 is an isolating carbon layer. However, also other materials like programmable metallization material (PMC cells) or transition metal oxide material (TMO cells) may be used.

Figure 10H:
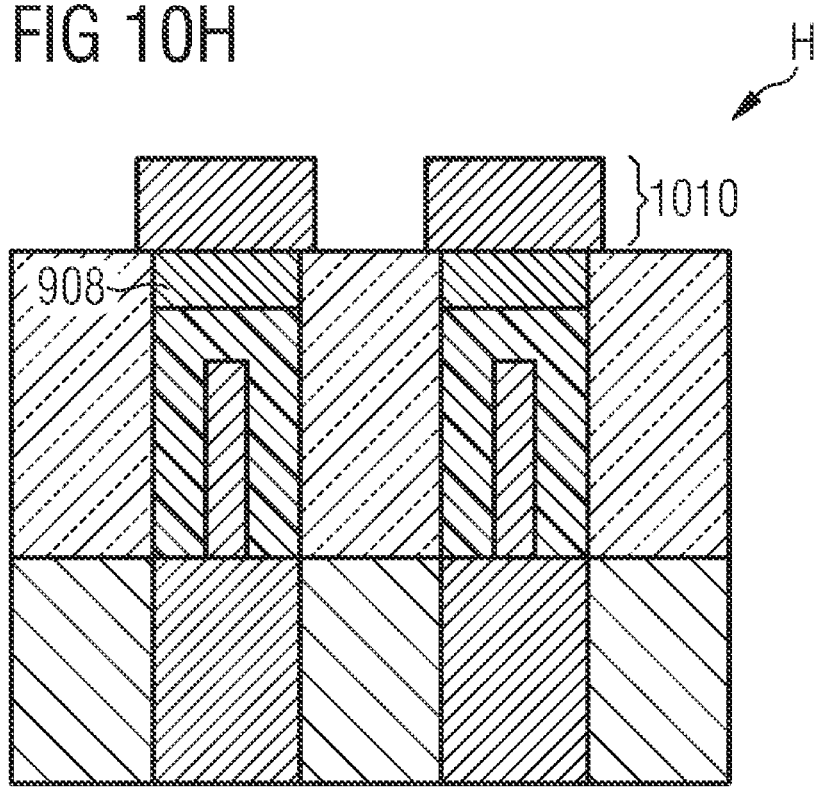

FIG. 10H shows a manufacturing stage H obtained after having filled remaining space 1008 within the trenches 910 with conductive material 908 (forming the top electrodes). Here, it is assumed that the conductive material 908 is conductive carbon. However, also other conductive materials like metals can be used. Further, a patterned conductive layer 1010 (of, e.g., Al, Cu, TiN, or W) has been formed which contacts the conductive material 908.

In the following description, making reference to FIGS. 11A to 10G, a possible realization of the method 800 will be described.

Figure 11A:
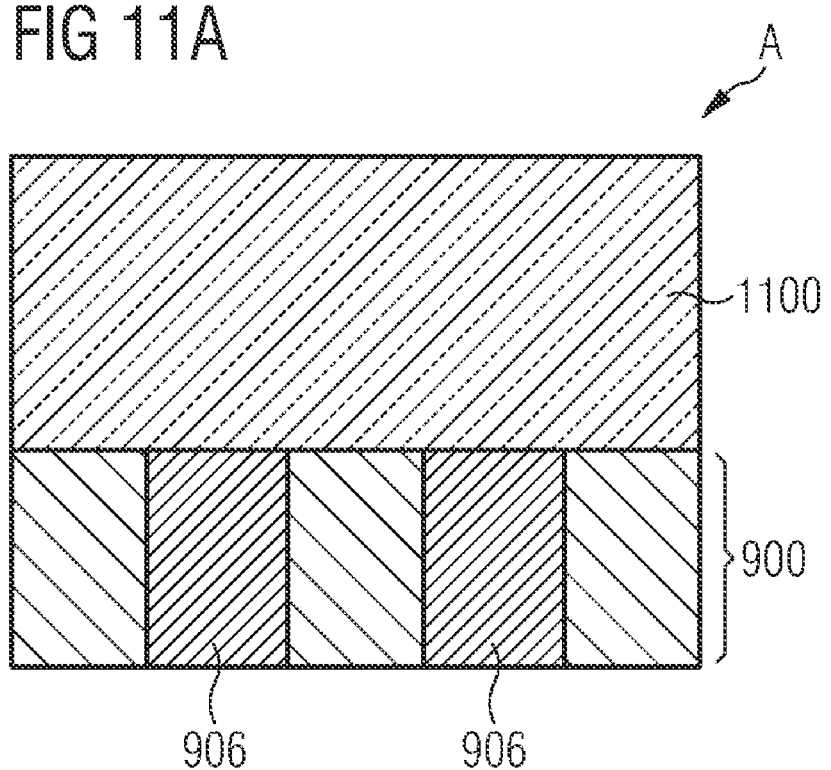
FIGS. 11A to 11G show a method of manufacturing an integrated circuit according to an embodiment.

FIG. 11A shows a manufacturing stage A obtained after having formed a conductive layer 1100 on a substrate 900. The substrate 900 has the same architecture as that shown in FIG. 10A. Here, it is assumed that the conductive layer 1100 is of conductive carbon. However, also other conductive materials like a metal may be used.

Figure 11B:
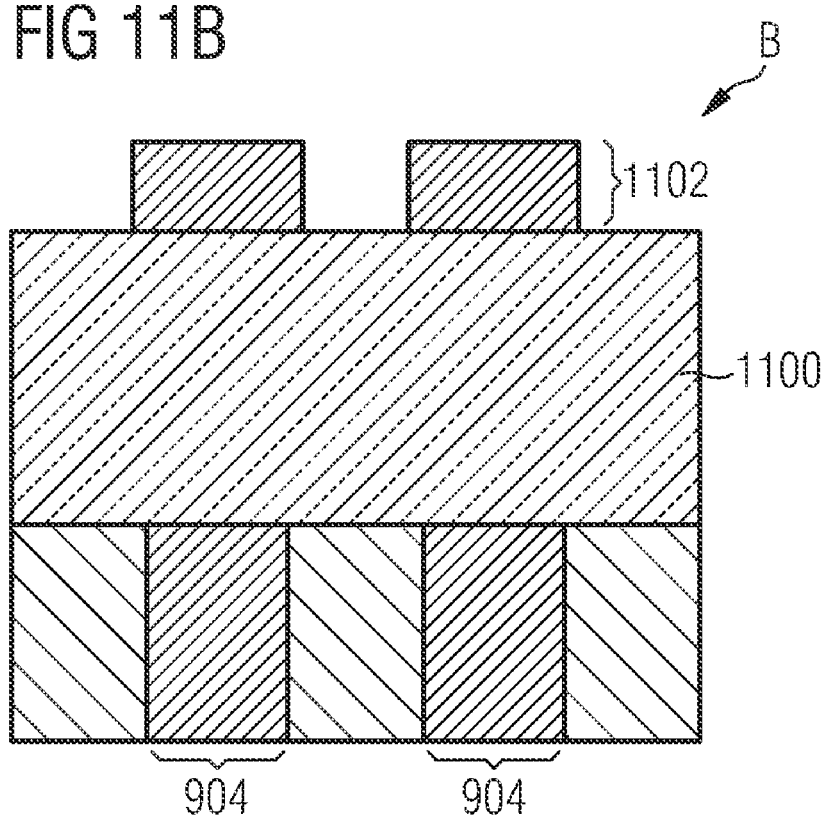

FIG. 11B shows a manufacturing stage B obtained after having formed a patterned hardmask layer 1102 on the conductive layer 1100. The hardmask parts are located over the conductive vias 904 (i.e., the hardmask parts have the same horizontal positions as that of the conductive vias 904). The hardmask layer 1102 may, for example, be a $SiO_2$ hardmask layer or a poly silicon hardmask layer.

Figure 11C:
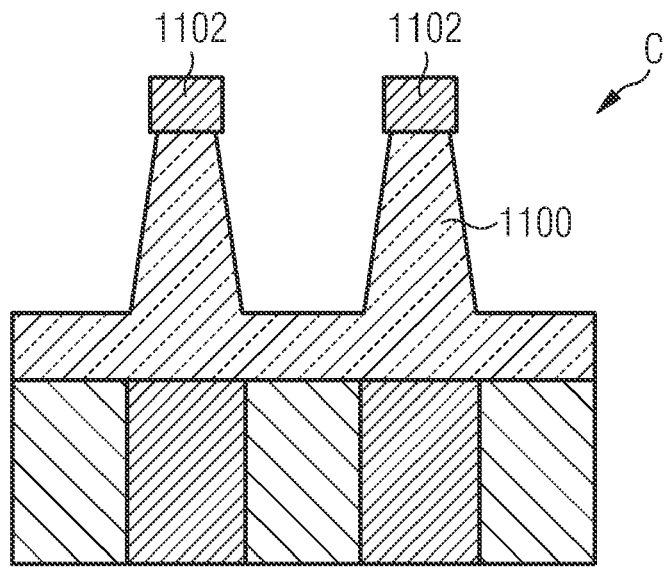

FIG. 11C shows a manufacturing stage C obtained after having etched the conductive layer 1100 over a period of time using the hardmask layer 1102 as an etching mask. The conductive layer 1100 may, for example, be etched using a reactive ion etching process.

Figure 11D:
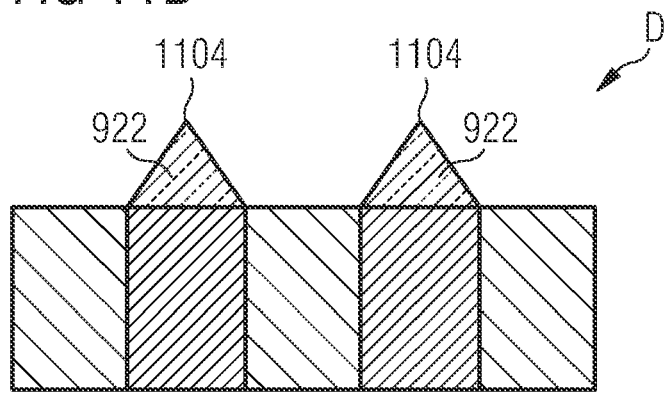

FIG. 11D shows a manufacturing stage D obtained after having etched the conductive layer 1100 using the hardmask layer 1102 as an etching mask until the hardmask layer 1102 has been disappeared. The remaining parts of the conductive layer 1100 form bottom electrodes 922 and respectively have a conical shape ending in a peak 11104.

Figure 11E:
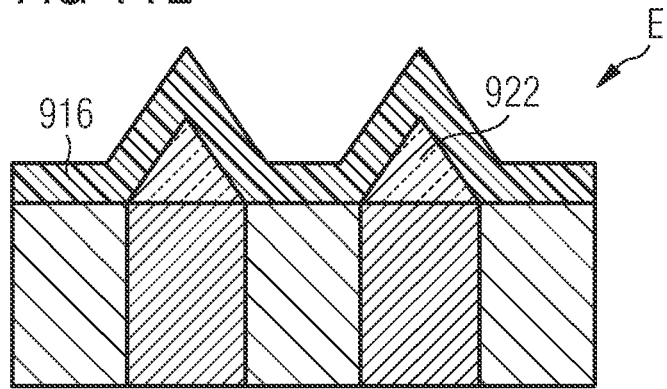

FIG. 11E shows a manufacturing stage E obtained after having formed a resistance changing layer 916 on the bottom electrodes 922. Due to the conical shape of the bottom electrodes 922, the resistance changing layer 916 has a zig-zag like shape. Here, it is assumed that the resistance changing layer 916 is an isolating carbon layer. However, other materials like programmable metallization material (PMC cells) or transition metal oxide material (TMO cells) may be used.

Figure 11F:
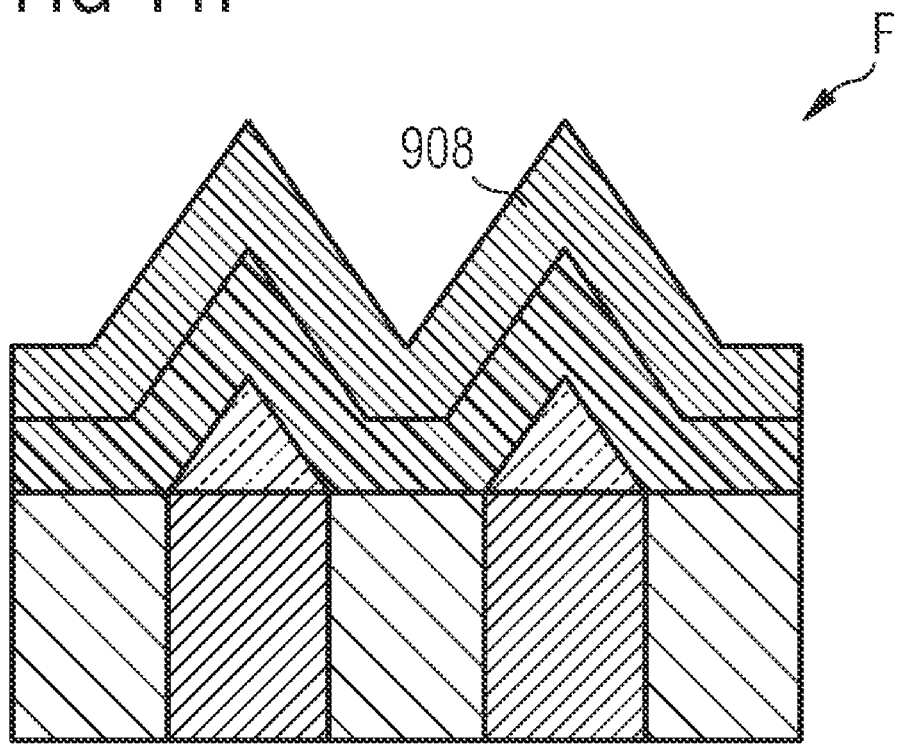

FIG. 11F shows a manufacturing stage F obtained after having formed a conductive layer 908 on the resistance changing layer 916. Due to the zig-zag like shape of the resistance changing layer 916, also the conductive layer 908 has a zig-zag like shape. The resistance changing layer 916 is a common continuous layer shared by a plurality of memory cells. In the same way, the conductive layer 908 is a common continuous layer shared by a plurality of memory cells. Due to the conical shape of the bottom electrodes 922, the danger of cross talk between neighboring memory cells can be reduced.

Figure 11G:
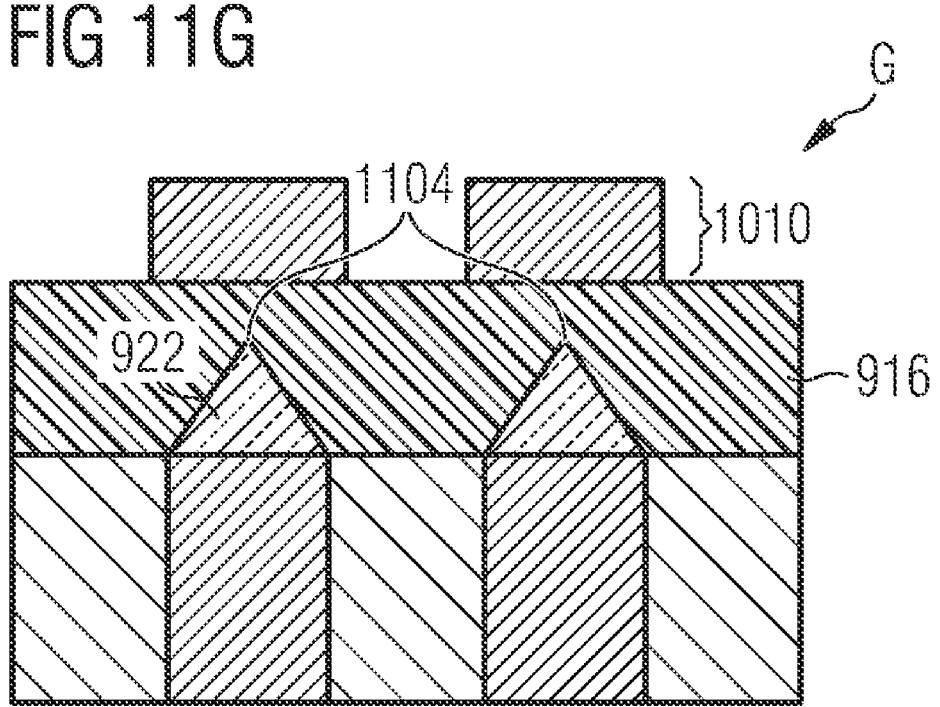

FIG. 11G shows a manufacturing stage G as an alternative to manufacturing stage 11E obtained after having formed a resistance changing layer 916 of an increased thickness, and after having carried out a planarization process. Further, a patterned conductive layer 1010 (e.g., of W, TiN, Al, or Cu) has been formed which contacts the resistance changing layer 916, each part of the conductive layer 1010 being located above a peak 1104 of the resistance changing layer 916

In the following description, making reference to FIGS. 12A to 12H, a possible realization of the method 800 will be described.

Figure 12A:
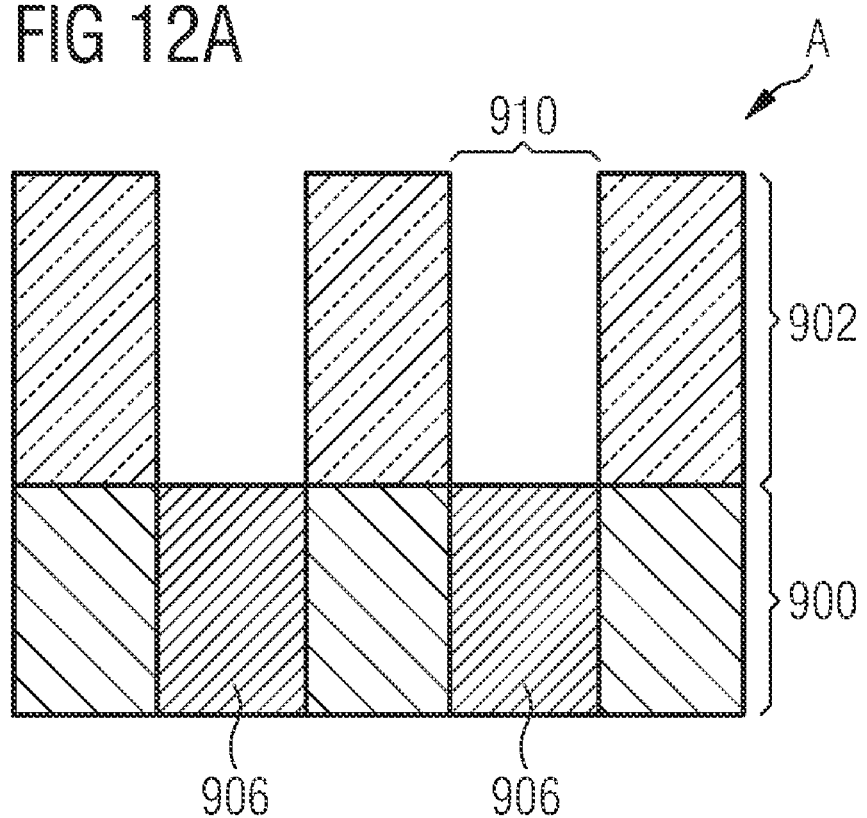
FIGS. 12A to 12H shows a method of manufacturing an integrated circuit according to an embodiment.
Figure 12B:
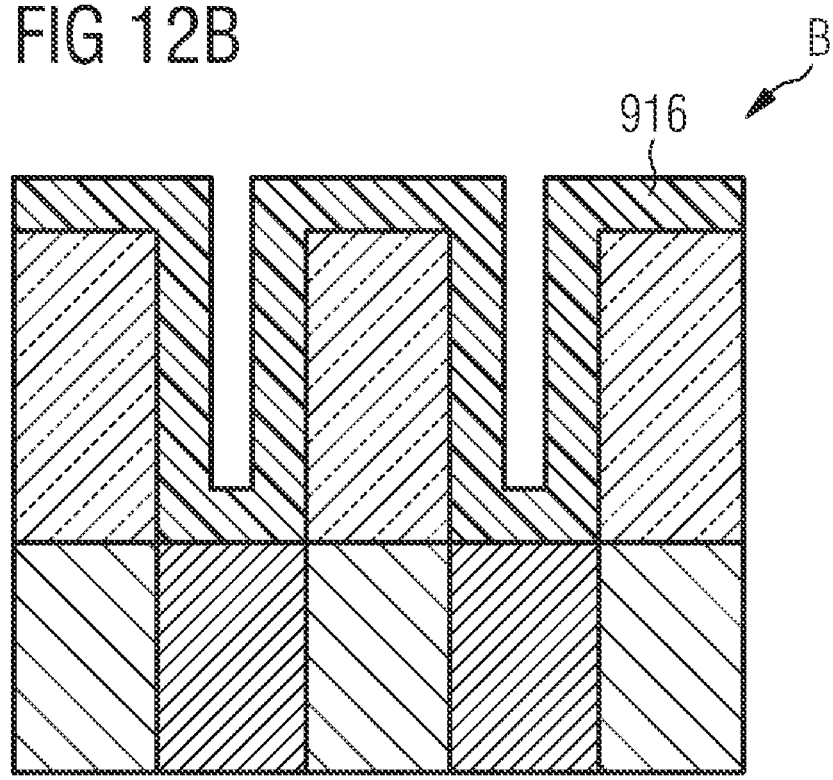
Figure 12C:
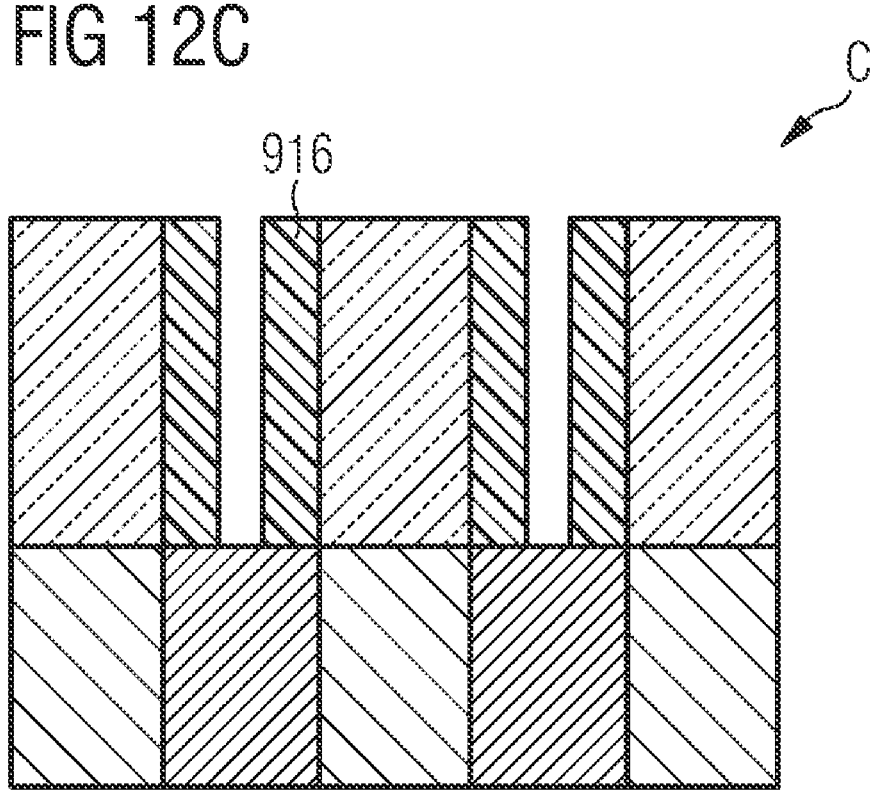

The manufacturing stages A to C shown in FIGS. 12A to 12C correspond to the manufacturing stages shown in FIGS. 10A to 10C with the only difference that the auxiliary layer 1000 has been replaced by a resistance changing layer 916.

Figure 12D:
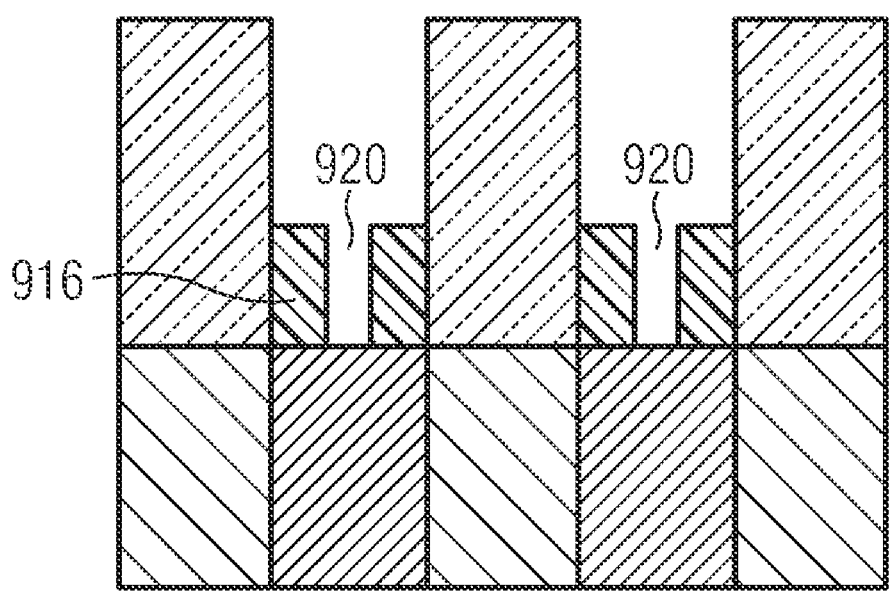

FIG. 12D shows a manufacturing stage D obtained after having removed the resistance changing layer 916 within an upper part of the trenches 910 using, for example, an etching process.

Figure 12E:
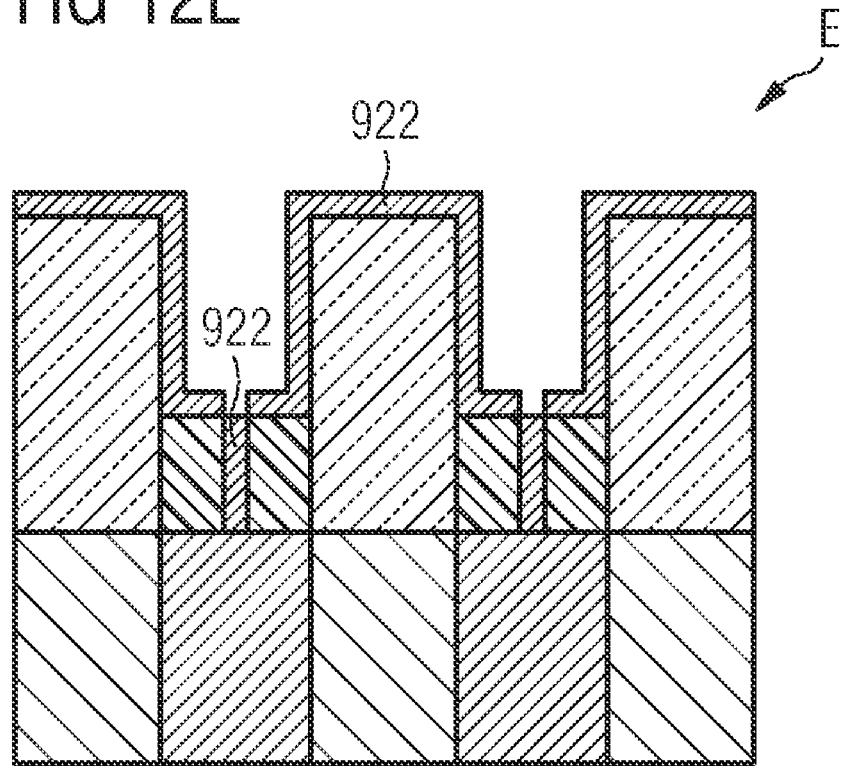

FIG. 12E shows a manufacturing stage E obtained after having formed a conductive layer 922 within the trenches 910 and on the top surface of the isolation layer 902 such that remaining space 920 within the lower part of the trenches 910 is filled with material of the conductive layer 922.

Figure 12F:
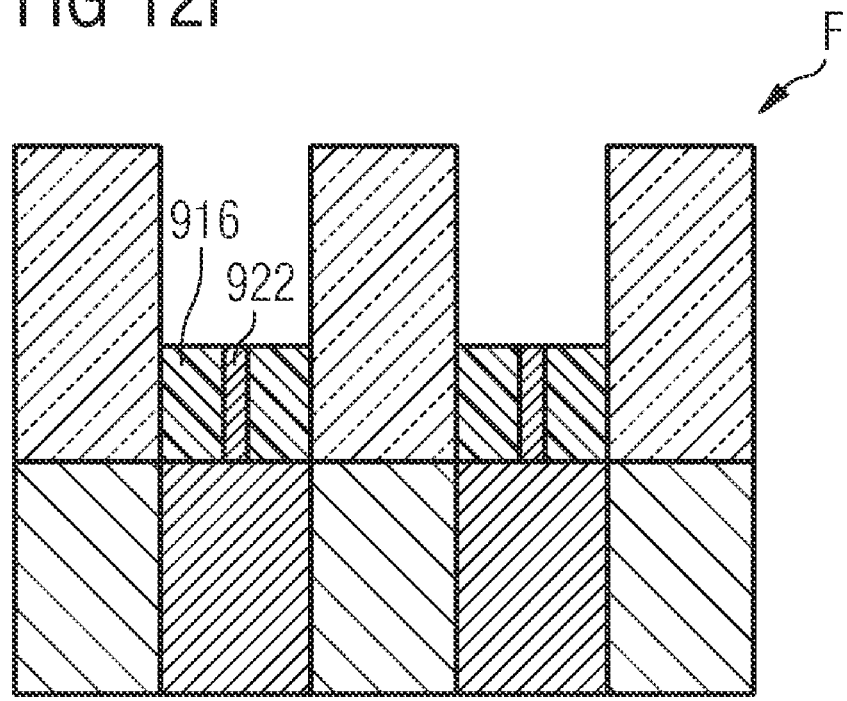

FIG. 12F shows a manufacturing stage F obtained after having removed the part of the conductive layer 922 located above the resistance changing layer 916 using, for example, an etching process.

Figure 12G:
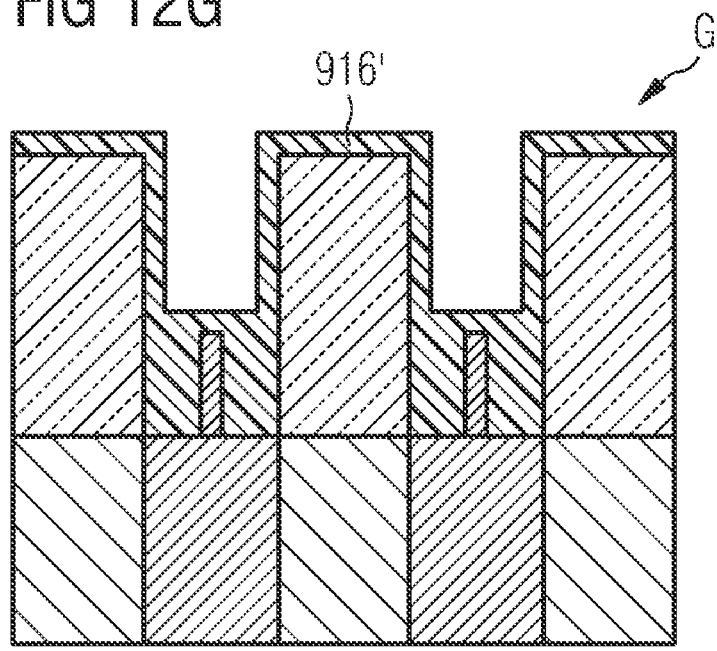

FIG. 12G shows a manufacturing stage G obtained after having formed a further resistance changing layer 916' within the trenches 910 such that the top end of the remaining conductive layer 922 within the trenches is covered with material of the resistance changing layer 916'.

Figure 12H:
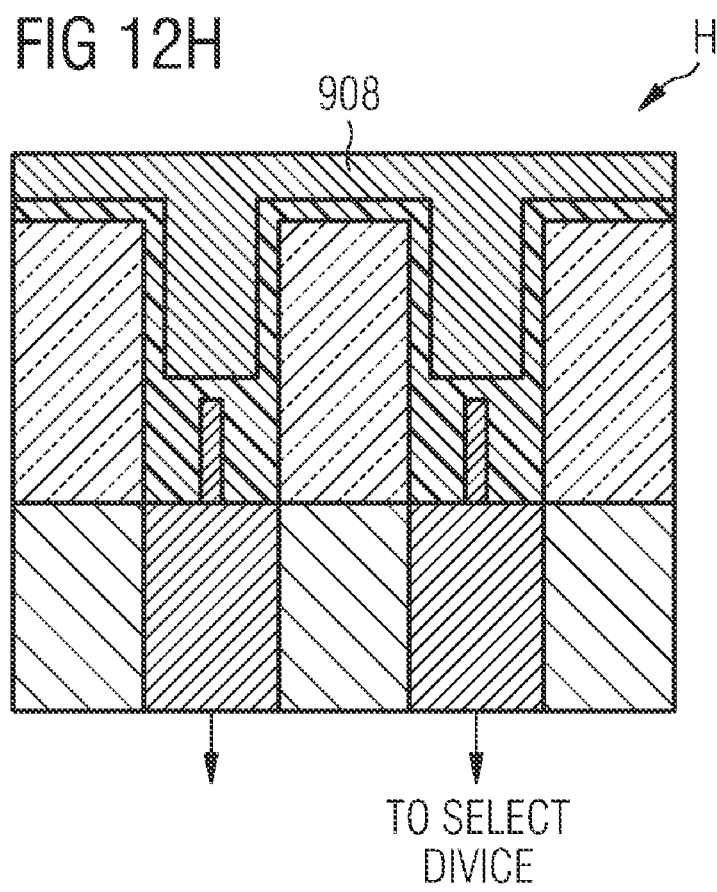

FIG. 12H shows a manufacturing stage H obtained after having filled the remaining space within the trenches 910 with conductive material 908. Here, it is assumed that the layers 908, 916 and 922 are made of carbon. However, as already mentioned in the previous embodiments, the present invention is not limited thereto.

In the following description, making reference to FIGS. 13A to 13G, a possible realization of the method 800 will be described.

Figure 13A:
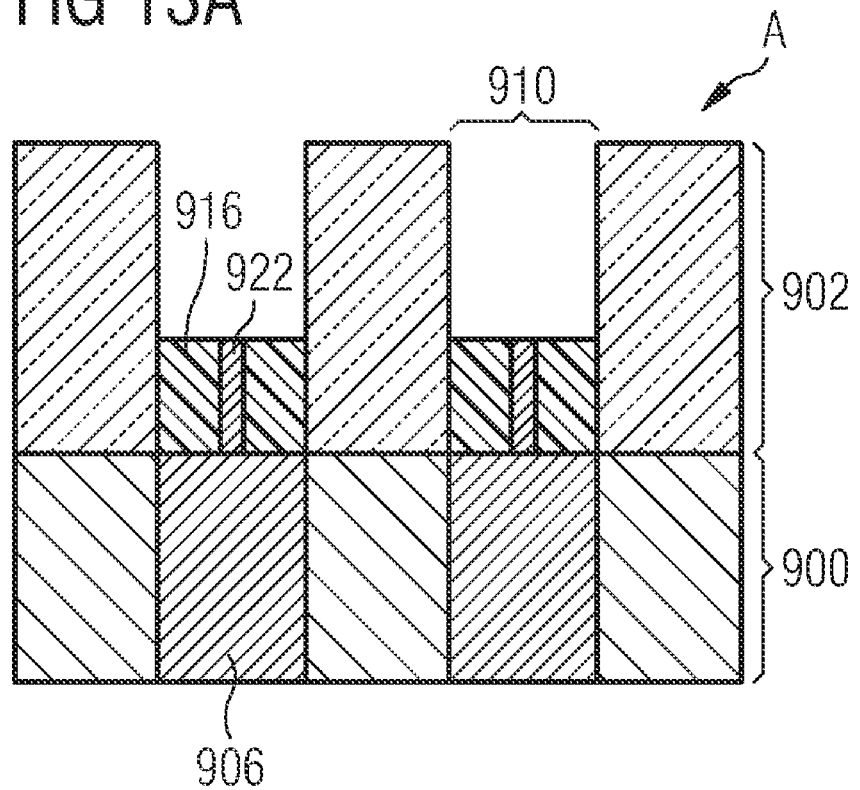
FIGS. 13A to 13G show a method of manufacturing an integrated circuit according to an embodiment.

FIG. 13A shows a manufacturing stage A which corresponds to the manufacturing stage F shown in FIG. 12F.

Figure 13B:
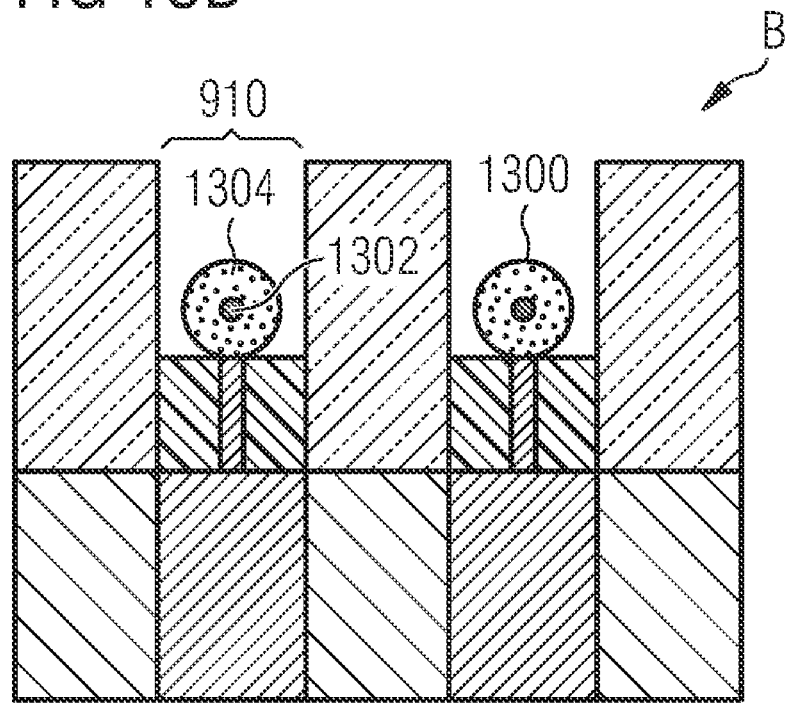

FIG. 13B shows a manufacturing stage B obtained after having placed nano cavity elements 1300 within the trenches 910. The nano cavity elements 1300 comprise inner material 1302 being surrounded by outer material 1304. The inner material 1302 is used later on as a patterning mask and is made of inorganic material like a metal, whereas the outer material 1304 is made of organic material like a bio molecule.

Figure 13C:
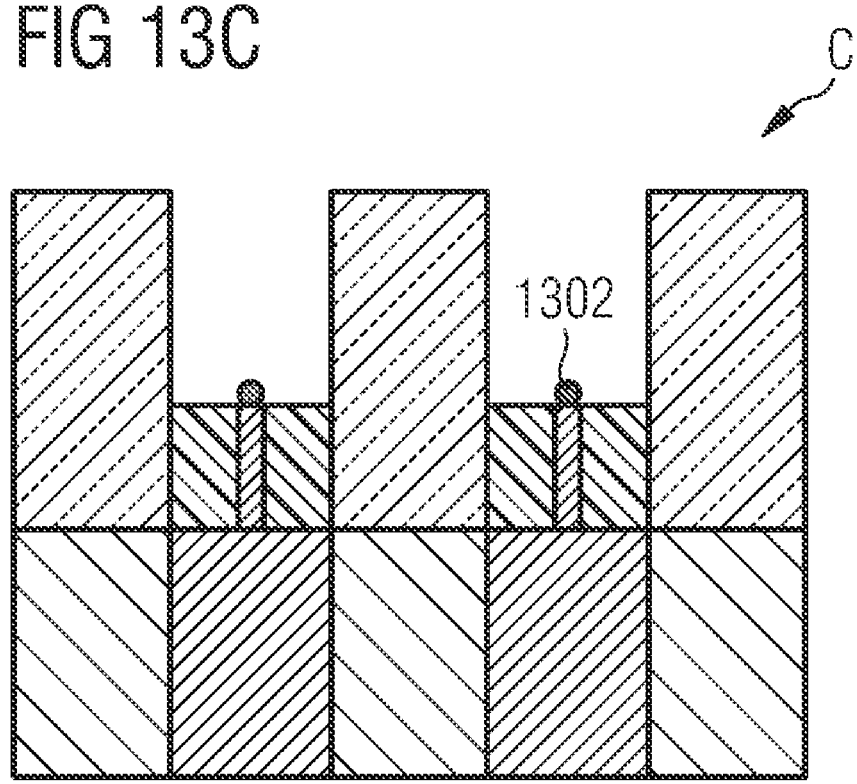

FIG. 13C shows a manufacturing stage C obtained after having selectively removed the outer material 1304 such that the inner material 1302 remains. The removal of the outer material 1304 may, for example, be carried out using an UV treatment or a heat treatment which destroys the outer material 1304. Since the inner material 1302 is centered with respect to the outer material 1304, and since the nano cavity elements 1300 are substantially centered (due to self adjusting effects) with respect to the trenches 910 (due to the relative sizes of the nano cavity elements 1300 and the trenches 910), the inner material also remains centered with respect to the trenches 910 after the outer material 1304 has been removed. That is, the inner material 1302 is positioned on the conductive material 922 which is also centered with respect to the trenches 910.

Figure 13D:
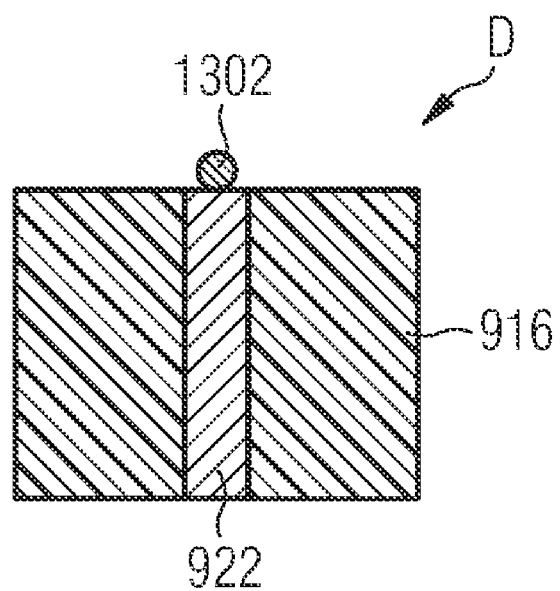

As shown in FIG. 13D, the lateral dimensions of the inner material 1302 are smaller than the lateral dimensions of the conductive material 922. That is, the inner material 1302 does not cover the whole top surface of the conductive material 922.

Figure 13E:
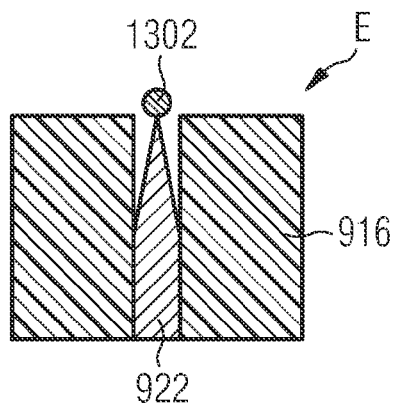

FIG. 13E shows a manufacturing stage E obtained after having patterned a top part of the conductive material 922 using the inner material 1302 as an etching mask. The patterning may, for example, be carried out using an etching process. This results in a needle like shape of the top part of the conductive material 922.

Figure 13F:
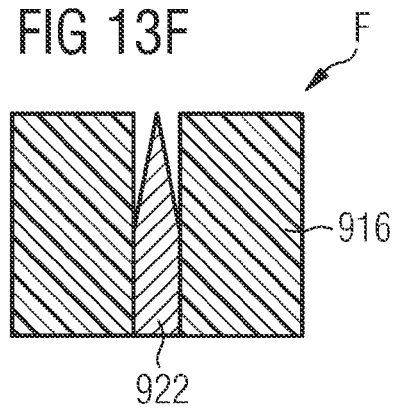

FIG. 13F shows a manufacturing stage F obtained after having removed the inner material 1302 using, for example, a selective etching process, or after having patterned the conductive material 922 until the inner material 1302 has completely disappeared.

Figure 13G:
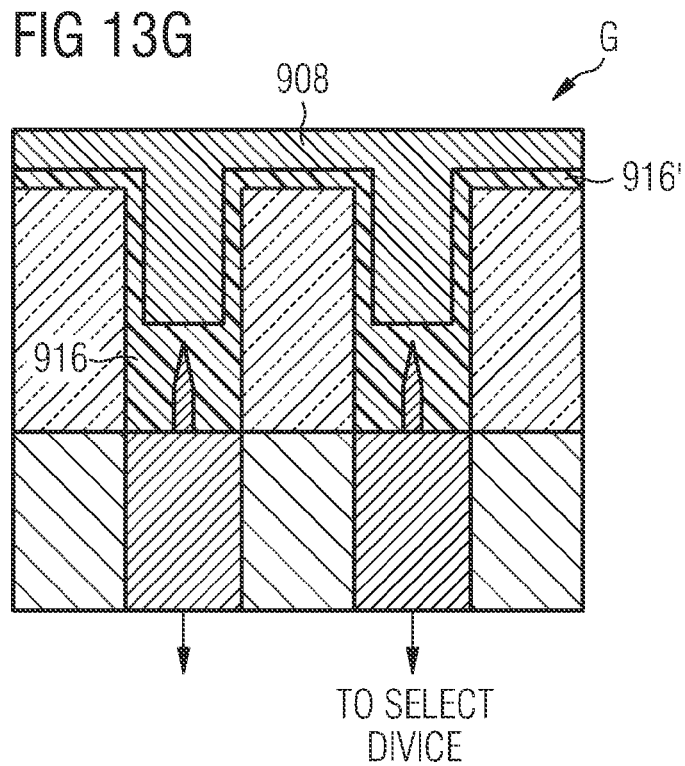

FIG. 13G shows a manufacturing stage G obtained after having filled the removed part of the conductive material 922 with a further resistance changing layer 916' which also covers the upper parts of the side walls of the trenches 910. Further, remaining space within the trenches 910 has been filled with conductive material 908.

In other words, FIGS. 13A to 13G show the manufacturing of needle-like structures by means of a sublithographic shadow mask. The fabrication follows an approach of Ichiro Yamashita presented in the proceedings of the IEDM 2006 ("Bio Nano Process: Fabrication of Nanoelectronic Devices Using Protein Supramolecules"), the content thereof being incorporated into the application by reference. According to an embodiment, a protein cavity is used as a spatially restricted biomineralization space, and nanoparticles with identical size are produced in the cavity. Through the interaction of the protein outer surface, proteins accommodating nanoparticle self-assemble into a hetero nanostructure of a protein and nano particles on a substrate. After having selectively removed the protein portion of the hetero nanostructure, a nanometric inorganic structure is obtained. The appropriate designing of this process can produce components of electronic devices with nanometric accuracy not only easily but also economically. The protein-coated nanoparticles are deposited in the structures, as shown in FIG. 13B. According to an embodiment, the protein shells of ferritins are etched selectively by UV/Ozone treatment at 115° C. for 60 min to release, e.g., a Fe or Co core which is substantially smaller than the protein capped structure (see FIG. 13C and FIG. 13D). Subsequently, the Fe- or Co cores act as a shadow mask when etching the underlying carbon using an oxygen or hydrogen plasma. This leads to a formation of a needle-like, sharp carbon structure as indicated in FIG. 13E. After the removal of the nanoparticle (FIG. 13F) by a short dip in an acid bath, a conformal insulating carbon film or an appropriate other resistance-change material and a conductive top contact is deposited (FIG. 13G).

Although not shown, the bottom electrodes shown in FIG. 10H and the top electrodes shown in FIG. 9D may be manufactured to have a needle-like front surface shape as shown in FIG. 13G, or may have a rounded front surface shape.

Figure 14A:
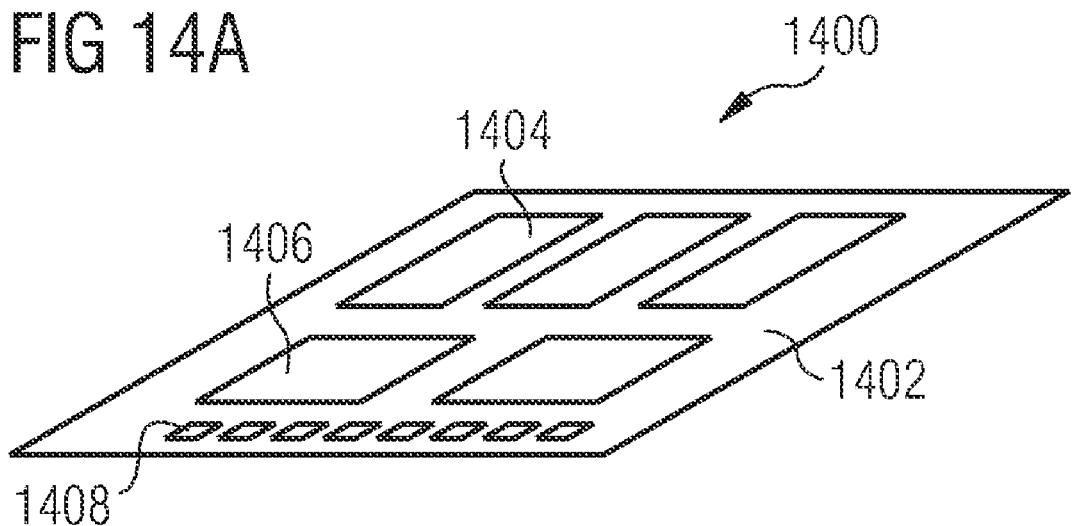
FIGS. 14A and 14B show memory modules according to an embodiment.
Figure 14B:
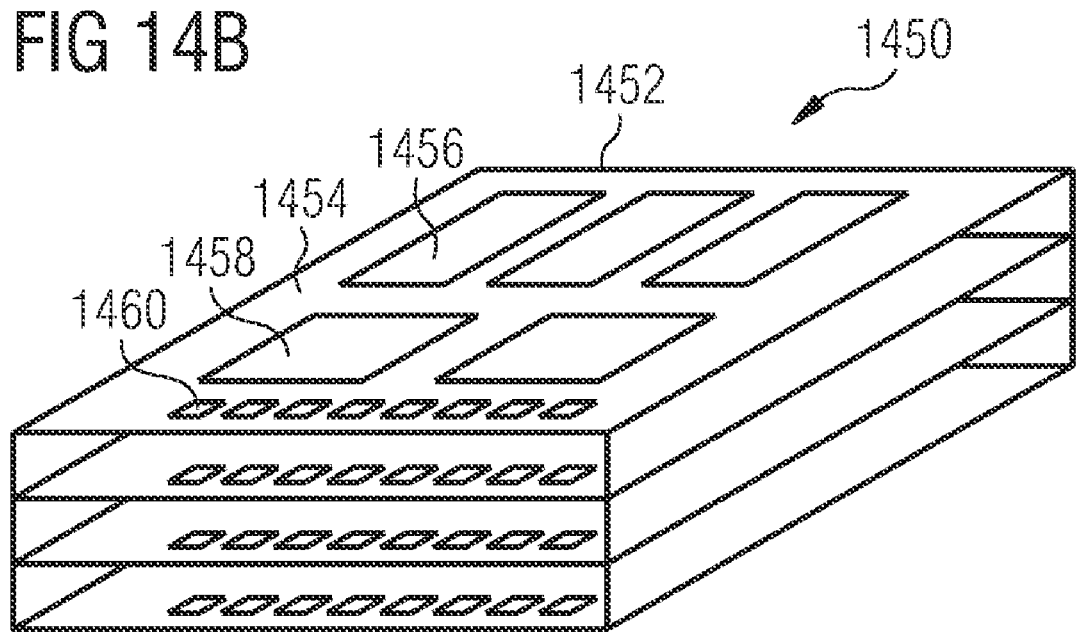

As shown in FIGS. 14A and 14B, in some embodiments, integrated circuits such as those described herein may be used in modules. In FIG. 14A, a memory module 1400 is shown, on which one or more integrated circuits 1404 are arranged on a substrate 1402. The memory module 1400 may also include one or more electronic devices 1406, which may include memory, processing circuitry, control circuitry, addressing circuitry, bus interconnection circuitry, or other circuitry or electronic devices that may be combined on a module with a memory device, such as the integrated circuits 1404. Additionally, the memory module 1400 includes multiple electrical connections 1408, which may be used to connect the memory module 1400 to other electronic components, including other modules.

As shown in FIG. 14B, in some embodiments, these modules may be stackable, to form a stack 1450. For example, a stackable memory module 1452 may contain one or more integrated circuits 1456, arranged on a stackable substrate 1454. The stackable memory module 1452 may also include one or more electronic devices 1458, which may include memory, processing circuitry, control circuitry, addressing circuitry, bus interconnection circuitry, or other circuitry or electronic devices that may be combined on a module with a memory device, such as the integrated circuits 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

According to an embodiment, an integrated circuit includes a plurality of resistance changing memory cells, each memory cell including a first electrode, a second electrode and resistance changing memory element arranged between the first electrode and the second electrode, wherein a front surface area of an end section of the first electrode facing the resistance changing memory element is smaller than a front surface area of an end section of the second electrode facing the resistance changing memory element.

According to an embodiment, the front surface area of the end section of the first electrode facing the resistance changing memory element has a rounded shape.

According to an embodiment, the end section of the first electrode facing the resistance changing memory element has a conical shape such that a cross-sectional area of the end section decreases towards the front surface of the end section of the first electrode facing the resistance changing memory element.

According to an embodiment, the front surface area of the end of the first electrode has a peak like shape.

According to an embodiment, the first electrode includes a middle section having a pillar like shape, wherein a cross-sectional area of the middle section is constant over the length of the middle section.

According to an embodiment, the resistance changing memory element covers the front surface and at least a part of the side surface of the first electrode.

According to an embodiment, each resistance changing memory cell is arranged within a trench, wherein a lower part of the trench is filled with resistance changing material forming the resistance changing memory element, and wherein the first electrode is embedded into the resistance changing material such that the first electrode is laterally surrounded by the resistance changing material, and wherein an upper part of the trench is filled with material forming the second electrode, or vice versa.

According to an embodiment, each resistance changing memory cell is arranged within a trench, wherein the trench is filled with resistance changing material forming the resistance changing memory element, wherein the first and the second electrode are embedded into the resistance changing material such that the side wall of the trench is covered by the resistance changing material.

According to an embodiment, the resistance changing material of a plurality of memory cells together forms a common continuous layer shared by a plurality of memory cells, and wherein the second electrode material of a plurality of memory cells together forms a common continuous second electrode layer shared by a plurality of memory cells.

According to an embodiment, the resistance changing layer and the second electrode layer respectively have a zig-zag like shape.

According to an embodiment, the memory cells are carbon memory cells.

According to an embodiment, the first electrode is made of conductive carbon.

According to an embodiment, the second electrode is made of conductive carbon.

According to an embodiment, the memory cells are phase changing memory cells.

According to an embodiment, the memory cells are programmable metallization memory cells.

According to an embodiment, the memory cells are transition metal oxide memory cells.

According to an embodiment, a method of manufacturing an integrated circuit comprising a plurality of resistance changing memory cells is provided, wherein the formation of each memory cell includes the formation of a first electrode, a second electrode and resistance changing memory element arranged between the first electrode and the second electrode, wherein the first electrode and the second electrode are formed such that a front surface area of an end section of the first electrode facing the resistance changing memory element is smaller than a front surface area of an end section of the second electrode facing the resistance changing memory element.

According to an embodiment, the formation of each memory cell includes: forming a trench within an isolation layer, wherein the bottom surface of the trench is formed by a top surface of a second electrode, covering the inner trench side surface and the top surface of the second electrode with a resistance changing layer, and forming a first electrode by filling remaining space within the trench with conductive material.

According to an embodiment, the formation of each memory cell includes: forming a trench within an isolation layer located over a conductive via formed within the isolation layer, covering the inner trench side surface and the inner trench bottom surface with an auxiliary layer, removing a part of the auxiliary layer covering the bottom surface of the trench, forming a first electrode by filling remaining space within the trench with conductive material, removing an upper part of the first electrode, removing the auxiliary layer, filling resistance changing material into a lower part of the trench such that the first electrode is covered with resistance change material, and forming a second electrode by filling remaining space within an upper part of the trench with conductive material.

According to an embodiment, the formation of each memory cell includes: forming a conductive layer on an insulating layer including a conductive via, forming a patterned hardmask layer, wherein remaining hardmask parts are positioned over the conductive vias, etching the conductive layer using the patterned hard mask as an etching mask until the hardmask has been etched away, thereby forming a conical shaped conductive first electrode on the conductive via, covering the first electrode with a resistance changing layer, and forming a second electrode on the resistance changing layer.

According to an embodiment, the formation of each memory cell includes: forming a trench within an isolation layer located over a conductive via formed within the isolation layer.

According to an embodiment, the inner trench side surface and the inner trench bottom surface is covered with a resistance changing layer, a part of the resistance changing layer covering the bottom surface of the trench is removed, an upper part of the resistance changing layer covering the inner trench side surface is removed, a first electrode is formed by forming a conductive layer within the trench such that the removed part of the resistance changing layer covering the bottom surface of the trench is filled with material of the conductive layer, the part of the conductive layer located above the remaining resistance changing layer is removed, a resistance changing layer within the trench is formed such that the inner trench surfaces and the top surface of the first electrode is covered by the resistance changing layer, and remaining space within the trench is filled with conductive material.

According to an embodiment, after having removed the part of the conductive layer located above the remaining resistance changing layer, and before having covered the inner trench surfaces and the top surface of the first electrode with the resistance changing layer, a nano cavity element is placed within the trench, the nano cavity having an inorganic inner material surrounded by an organic outer material, the organic outer material is selectively removed such that the remaining inorganic inner material is placed on the top surface of the first electrode, and the first electrode is selectively etched using the inorganic inner material as an etching mask.

According to an embodiment, the inner material of the nano cavity element is a metal, and the outer material of the nano cavity element is a protein.

According to an embodiment, the lateral dimensions of the nano cavity element and the position of the anorganic inner material relative to the nano cavity element as a whole are chosen such that, after having placed the nano cavity within the trench, the lateral position of the anorganic inner material is self adjusted with respect to the lateral position of the first electrode.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a plurality of resistance changing memory cells, each memory cell comprising a first electrode, a second electrode and a resistance changing memory element arranged between the first electrode and the second electrode, wherein a front surface area of an end section of the first electrode facing the resistance changing memory element is smaller than a front surface area of an end section of the second electrode facing the resistance changing memory element, wherein the front surface area of the end section of the first electrode facing the resistance changing memory element has one of (1) a rounded shape, (2) a peak like shape or (3) a conical shape such that a cross-sectional area of the end section decreases towards the front surface of the end section of the first electrode facing the resistance changing memory element, and wherein all of the front surface area of the end section is in contact with the resistance changing memory element; and wherein the front surface area of the end section of the first electrode facing the resistance changing memory element has a conical shape such that a cross-sectional area of the end section decreases towards the front surface of the end section of the first electrode facing the resistance changing memory element, and wherein the resistance changing element and the second electrode respectively have a zig-zag like shape.

2. The integrated circuit according to claim 1, wherein the memory cells are carbon memory cells.

3. The integrated circuit according to claim 1, wherein the first electrode comprises conductive carbon.

4. The integrated circuit according to claim 1, wherein the second electrode comprises conductive carbon.

5. The integrated circuit according to claim 1, wherein the memory cells are phase changing memory cells.

6. The integrated circuit according to claim 1, wherein the memory cells are programmable metallization memory cells.

7. The integrated circuit according to claim 1, wherein the memory cells are transition metal oxide memory cells.

8. An integrated circuit comprising a plurality of resistance changing memory cells, each memory cell comprising a first electrode, a second electrode and a resistance changing memory element arranged between the first electrode and the second electrode, wherein a front surface area of an end section of the first electrode facing the resistance changing memory element is smaller than a front surface area of an end section of the second electrode facing the resistance changing memory element, wherein the resistance changing memory element covers the front surface and at least a part of a side surface of the first electrode, wherein each resistance changing memory cell is arranged within a trench, wherein a lower portion of the trench is filled with resistance changing material forming the resistance changing memory element, and wherein the first electrode is embedded into the resistance changing material such that the first electrode is laterally surrounded by the resistance changing material, and wherein an upper portion of the trench is filled with material forming the second electrode.

9. An integrated circuit comprising a plurality of resistance changing memory cells, each memory cell comprising a first electrode, a second electrode and a resistance changing memory element arranged between the first electrode and the second electrode, wherein a front surface area of an end section of the first electrode facing the resistance changing memory element is smaller than a front surface area of an end section of the second electrode facing the resistance changing memory element, wherein the resistance changing memory element covers the front surface and at least a part of a side surface of the first electrode, wherein each resistance changing memory cell is arranged within a trench, wherein the trench is filled with resistance changing material forming the resistance changing memory element, wherein the first and the second electrode are embedded into the resistance changing material such that a side wall of the trench is covered by the resistance changing material.

* * * * *